US010515851B2

(12) United States Patent
Yu et al.

(10) Patent No.: US 10,515,851 B2
(45) Date of Patent: Dec. 24, 2019

(54) METHOD FOR FORMING SEMICONDUCTOR DEVICE STRUCTURE WITH CONDUCTIVE SHIELDING STRUCTURE

(71) Applicant: Taiwan Semiconductor Manufacturing Co., Ltd., Hsinchu (TW)

(72) Inventors: Chen-Hua Yu, Hsinchu (TW); Chuei-Tang Wang, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/707,534

(22) Filed: Sep. 18, 2017

(65) Prior Publication Data

US 2019/0088544 A1     Mar. 21, 2019

(51) Int. Cl.
*H01L 23/48*       (2006.01)
*H01L 23/498*      (2006.01)
(Continued)

(52) U.S. Cl.
CPC ...... *H01L 21/76898* (2013.01); *H01L 21/486* (2013.01); *H01L 21/76831* (2013.01); *H01L 21/76877* (2013.01); *H01L 23/3114* (2013.01); *H01L 23/481* (2013.01); *H01L 23/49827* (2013.01); *H01L 23/552* (2013.01); *H01L 24/11* (2013.01); *H01L 25/0655* (2013.01); *H01L 28/90* (2013.01); *H01L 28/91* (2013.01);
(Continued)

(58) Field of Classification Search
CPC ........... H01L 23/49827; H01L 23/5384; H01L 21/76802–76817; H01L 21/76877–76883; H01L 21/76898; H01L 23/481; H01L 21/76841–76843; H01L 28/90–92; H01L 23/552; H01L 21/486
See application file for complete search history.

(56) References Cited

U.S. PATENT DOCUMENTS 8,916,979 B2    12/2014  Tsai et al.
9,355,948 B2     5/2016  Oganesian et al.
(Continued)

FOREIGN PATENT DOCUMENTS

KR    10-2015-0012574 A    2/2015
WO    WO 2017/052471 A1    3/2017

*Primary Examiner* — Nelson Garces
(74) *Attorney, Agent, or Firm* — Birch, Stewart, Kolasch & Birch, LLP

(57) ABSTRACT

A method for forming a semiconductor device structure is provided. The method includes forming a first hole and a second hole in a first surface of a substrate. The method includes forming a first insulating layer in the first hole and the second hole. The method includes forming a conductive layer over the first insulating layer and in the first hole and the second hole. The method includes forming a second insulating layer over the conductive layer in the first recess. The second insulating layer has a second recess in the first recess. The method includes forming a conductive structure in the second recess. The method includes partially removing the substrate, the first insulating layer, the conductive layer, and the second insulating layer from a second surface of the substrate to expose the conductive structure and the conductive layer in the first hole and the second hole.

20 Claims, 20 Drawing Sheets

(51) Int. Cl.
  *H01L 23/552* (2006.01)
  *H01L 21/768* (2006.01)
  *H01L 23/31* (2006.01)
  *H01L 23/00* (2006.01)
  *H01L 49/02* (2006.01)
  *H01L 21/48* (2006.01)
  *H01L 25/065* (2006.01)

(52) U.S. Cl.
  CPC .............. *H01L 28/92* (2013.01); *H01L 24/16* (2013.01); *H01L 24/29* (2013.01); *H01L 24/32* (2013.01); *H01L 24/73* (2013.01); *H01L 2224/13* (2013.01); *H01L 2224/16225* (2013.01); *H01L 2224/2919* (2013.01); *H01L 2224/32225* (2013.01); *H01L 2224/73204* (2013.01); *H01L 2924/00014* (2013.01); *H01L 2924/14* (2013.01)

(56) References Cited

U.S. PATENT DOCUMENTS

| | | |
|---|---|---|
| 9,368,440 B1 | 6/2016 | Hool |
| 2006/0166498 A1 | 7/2006 | Kirby |
| 2007/0290300 A1 | 12/2007 | Kawakami |
| 2009/0243074 A1 | 10/2009 | Ramiah et al. |
| 2011/0210426 A1 | 9/2011 | Matsui |
| 2012/0049322 A1* | 3/2012 | Su ................... H01L 21/76898 257/532 |
| 2014/0091458 A1* | 4/2014 | Van Gemert ......... H01L 21/561 257/737 |
| 2015/0028450 A1 | 1/2015 | Park et al. |

* cited by examiner

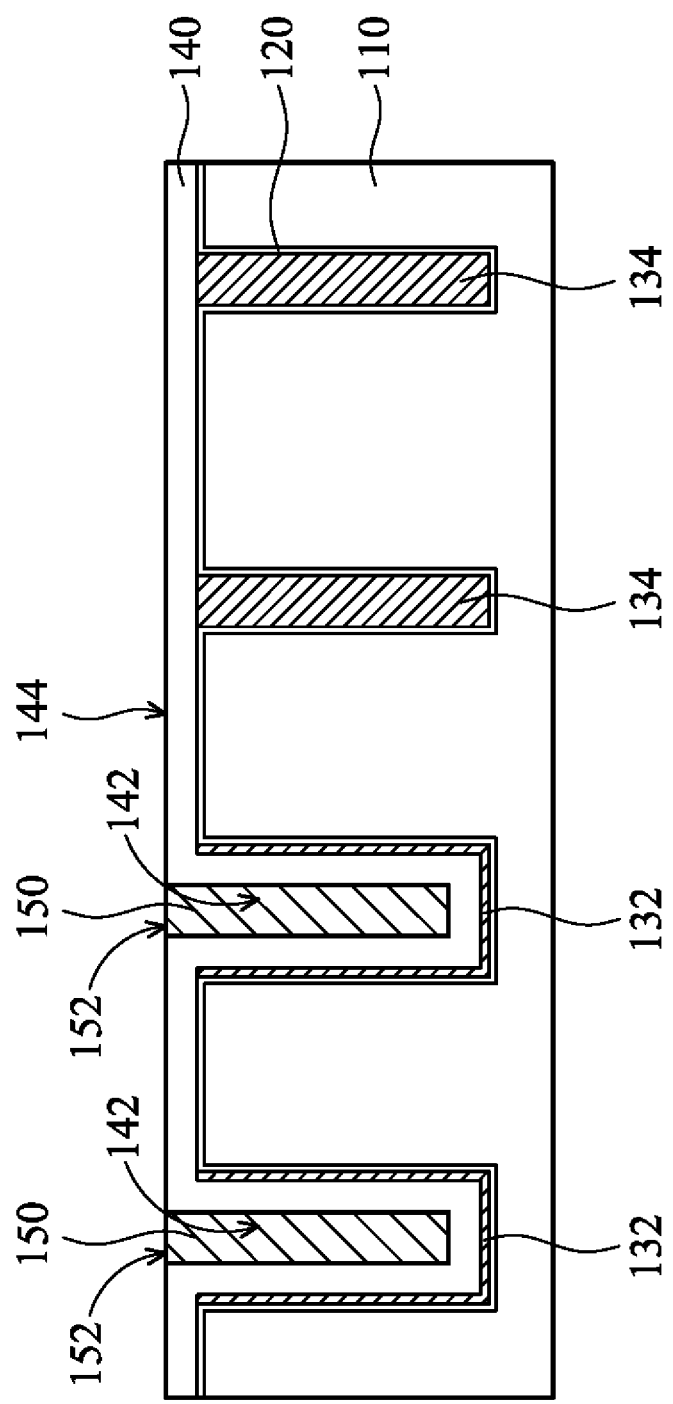

METHOD FOR FORMING SEMICONDUCTOR DEVICE STRUCTURE WITH CONDUCTIVE SHIELDING STRUCTURE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes (e.g., sizes of chip package structures) continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1N-1 is a top view of a region of the semiconductor device structure of FIG. 1N, in accordance with some embodiments.

DETAILED DESCRIPTION

Figure 1A:
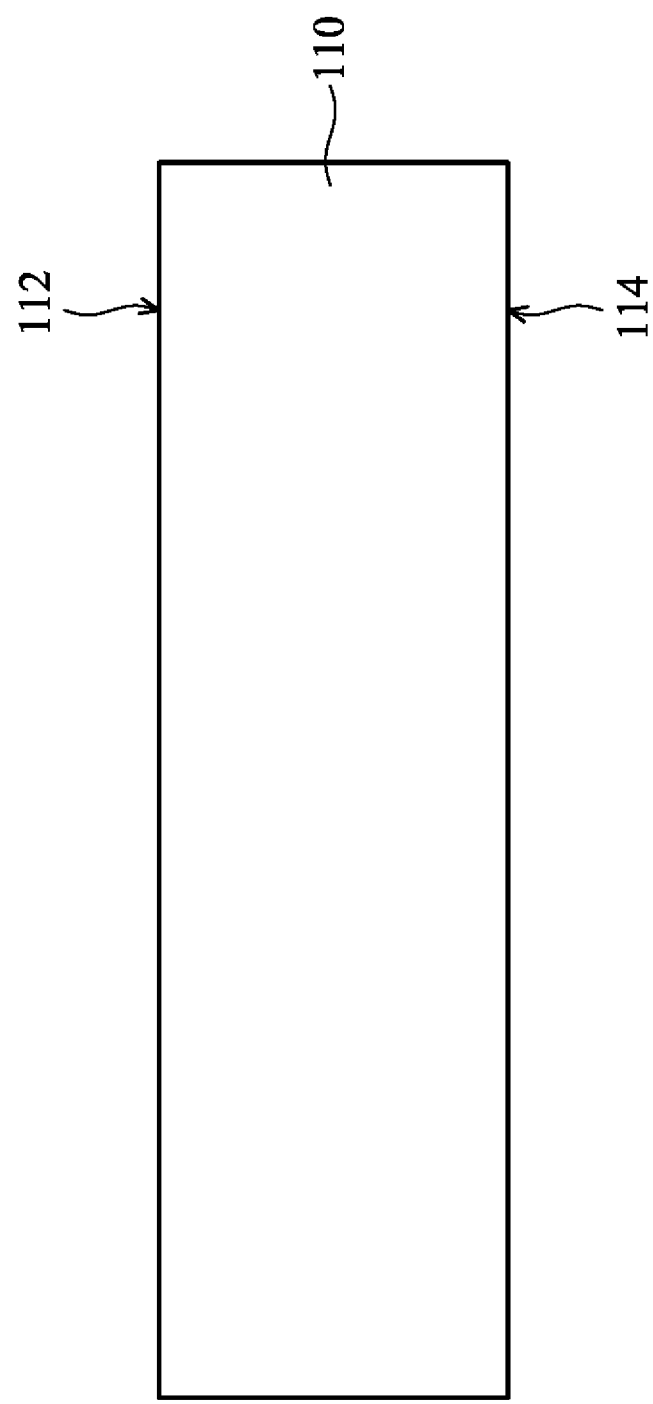
FIGS. 1A-1O are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
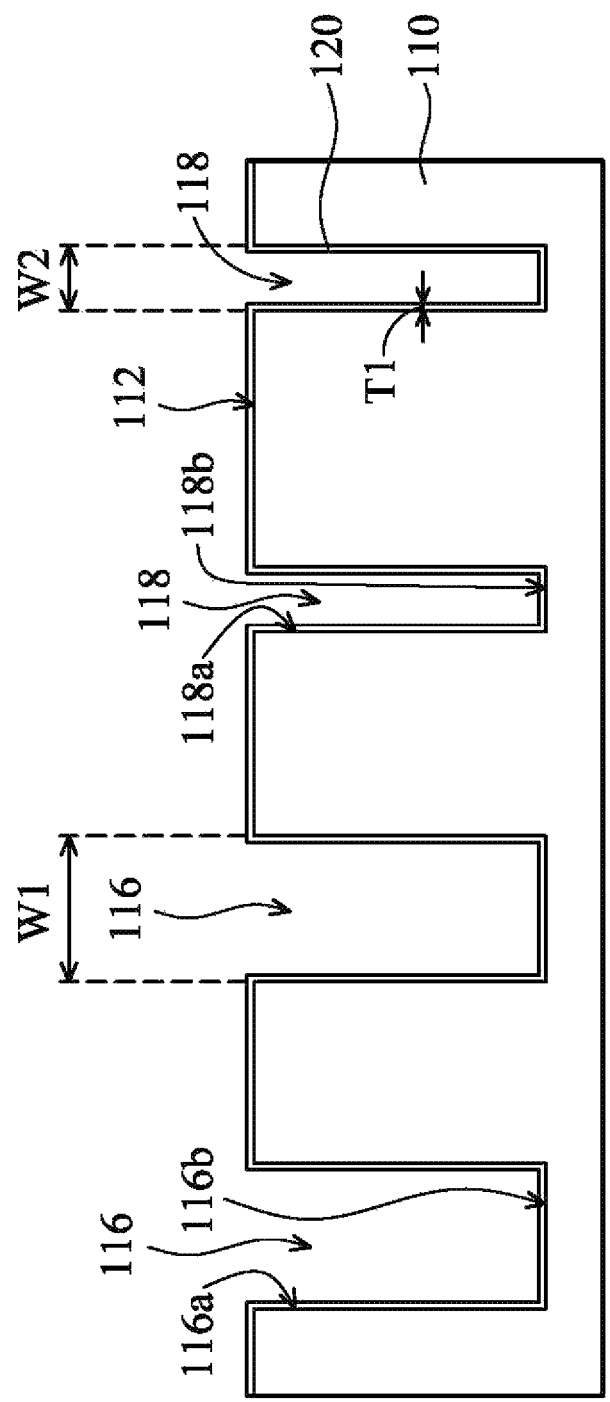
Figure 1C:
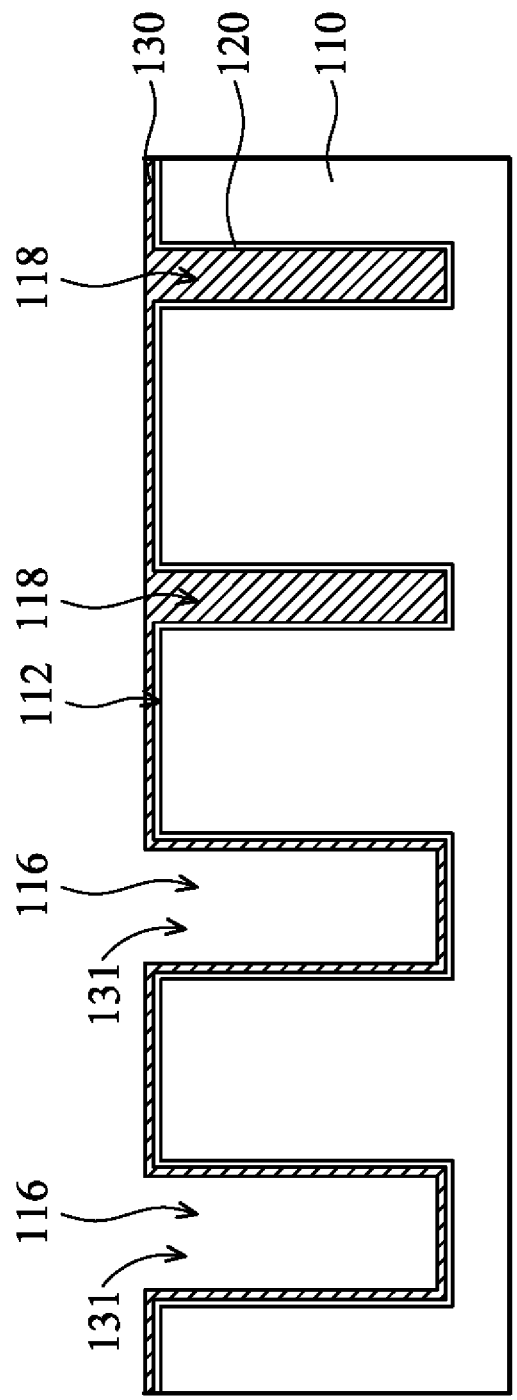
Figure 1D:
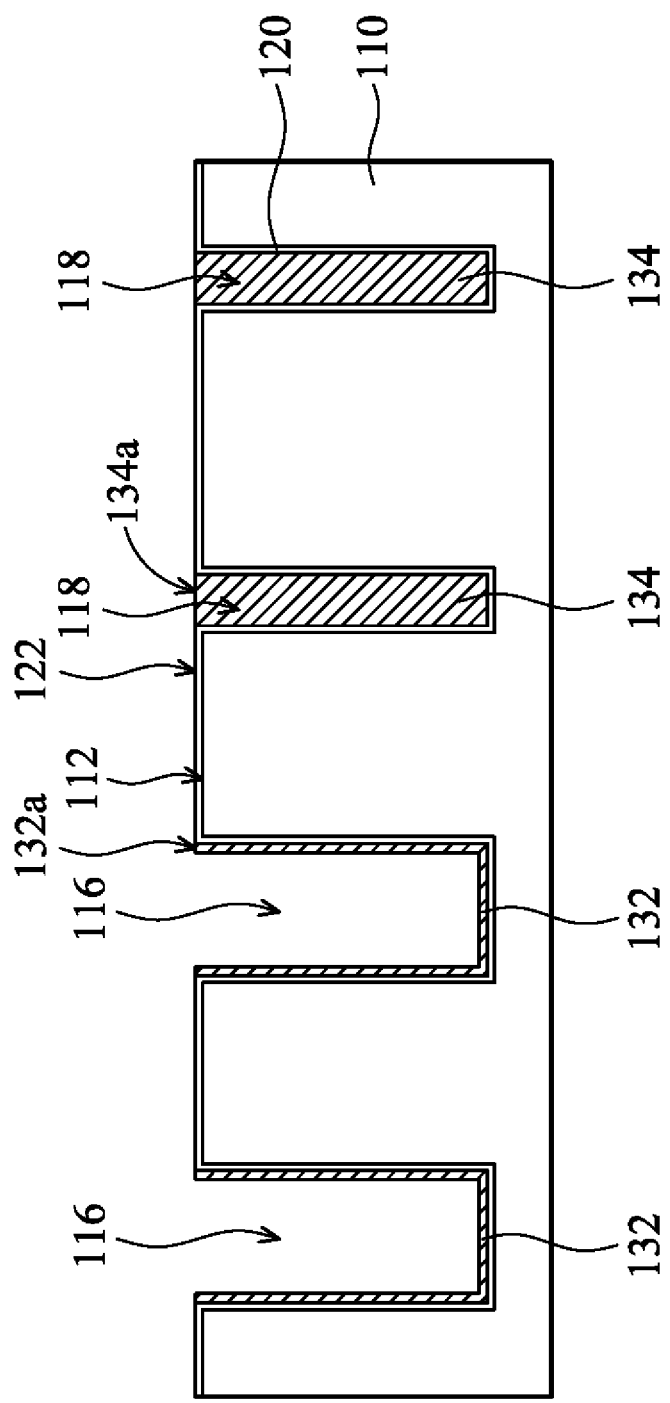
Figure 1E:
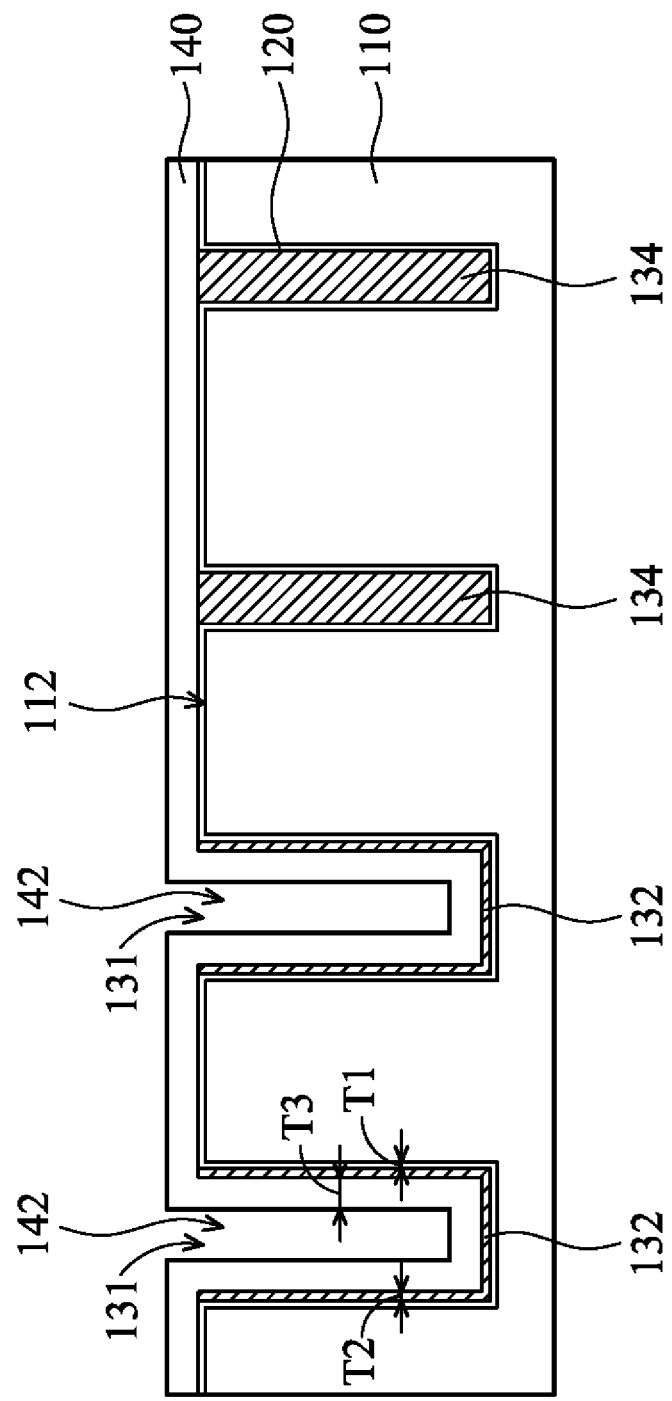
Figure 1F:
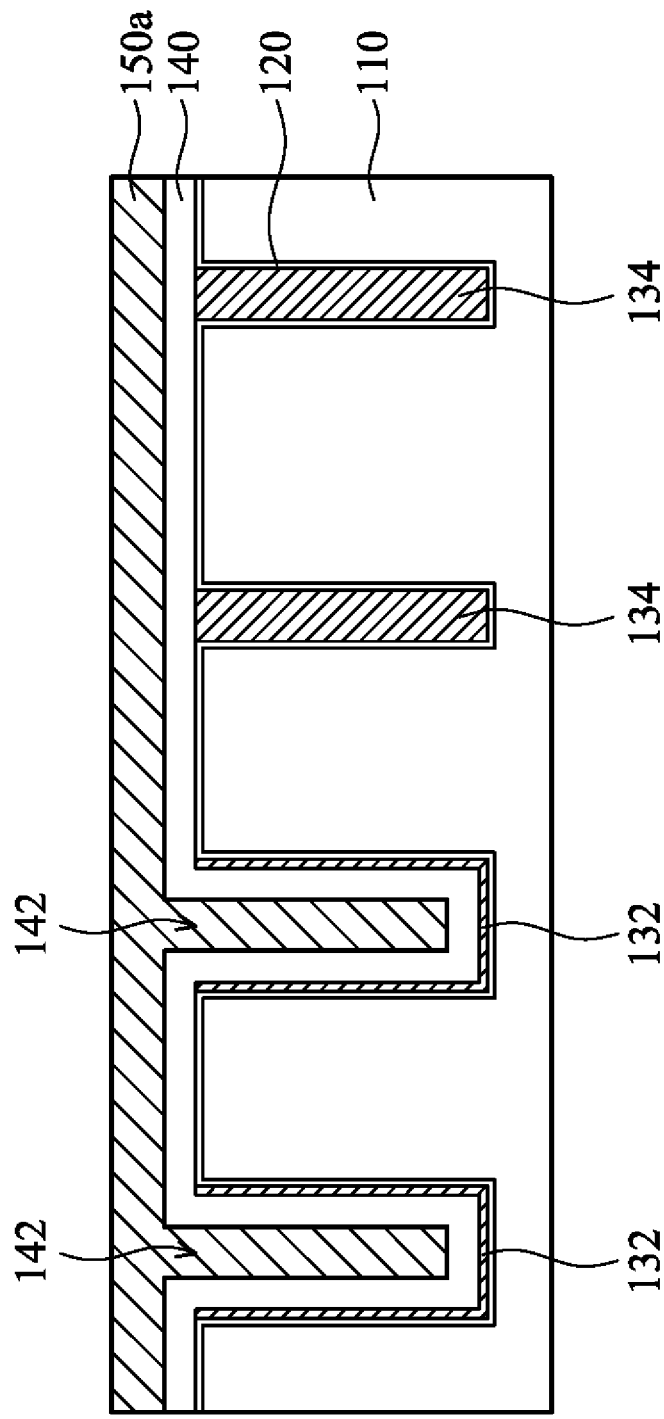
Figure 1H:
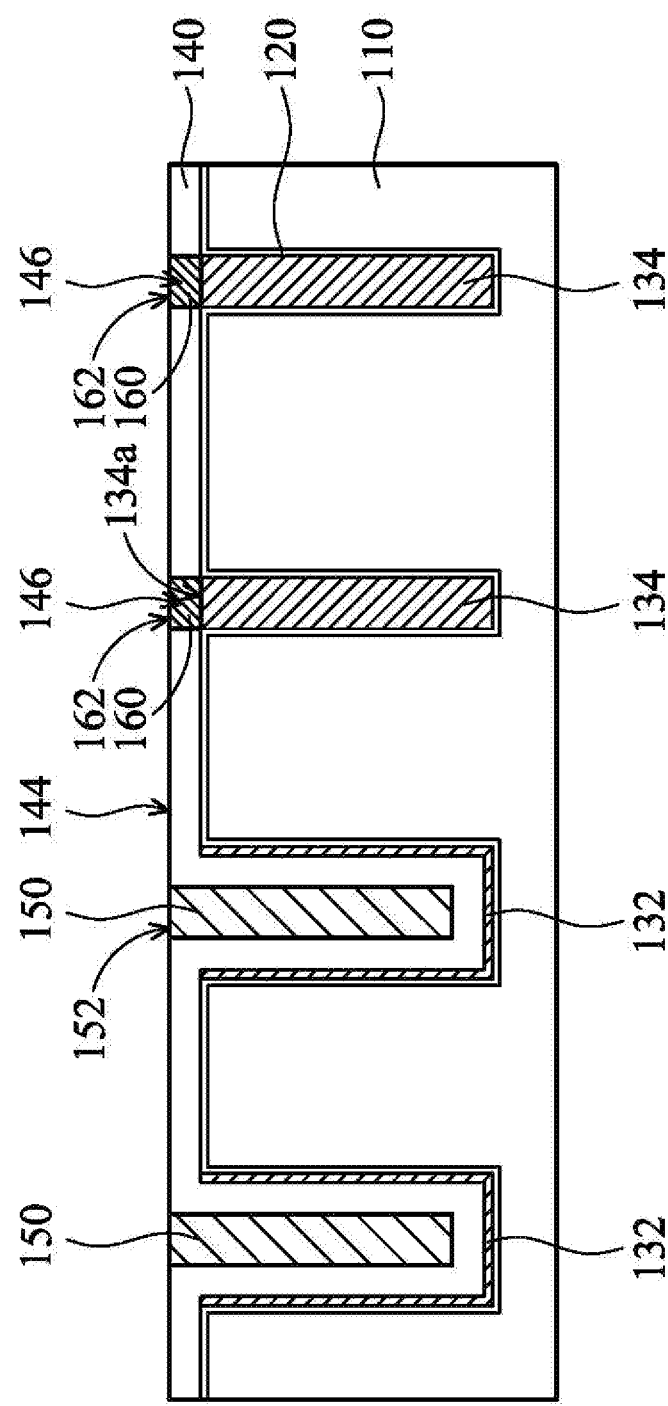
Figure 1I:
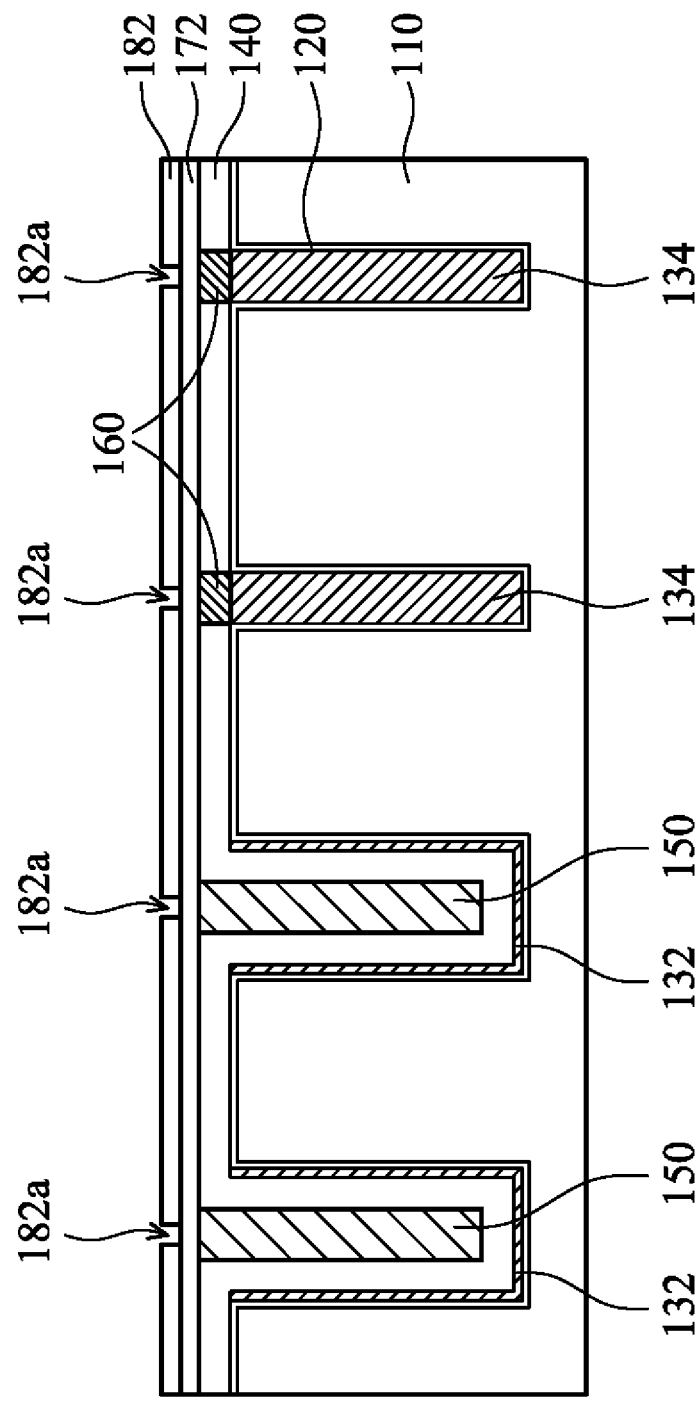
Figure 1J:
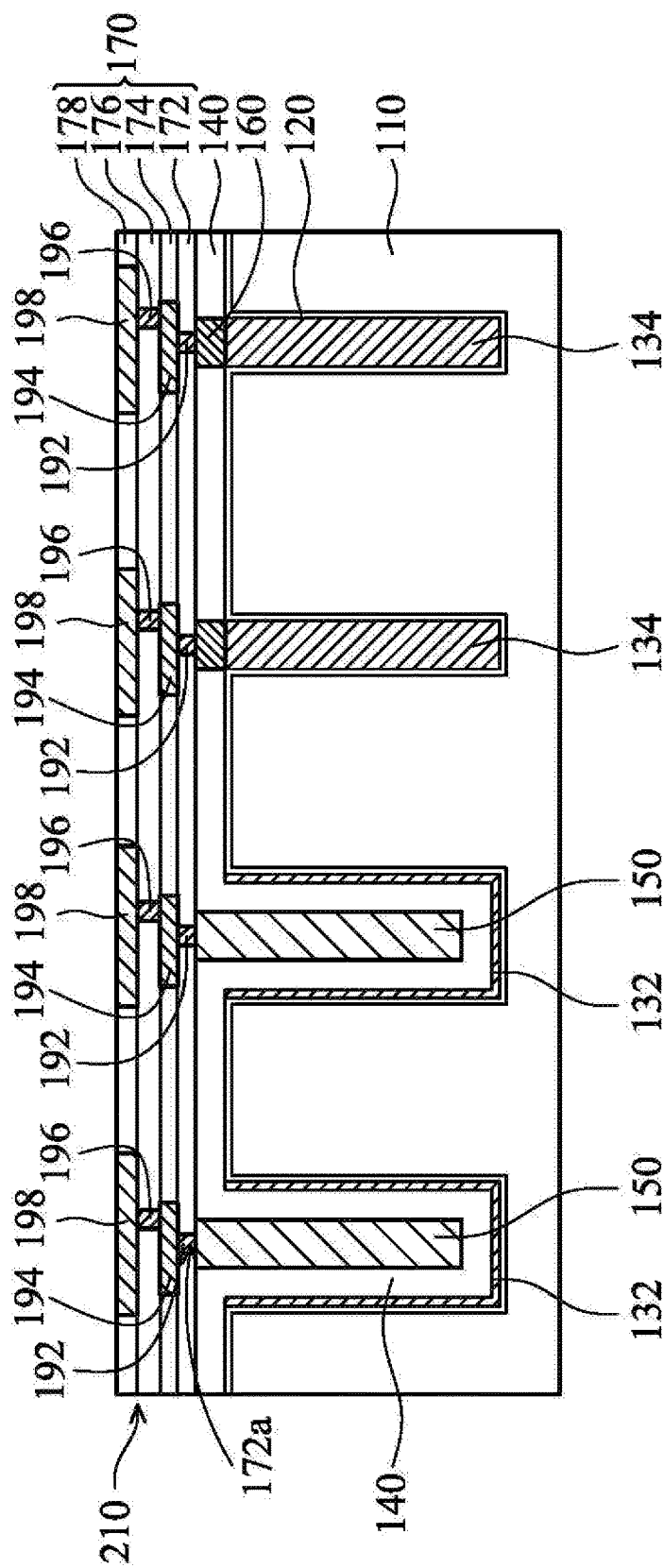
Figure 1K:
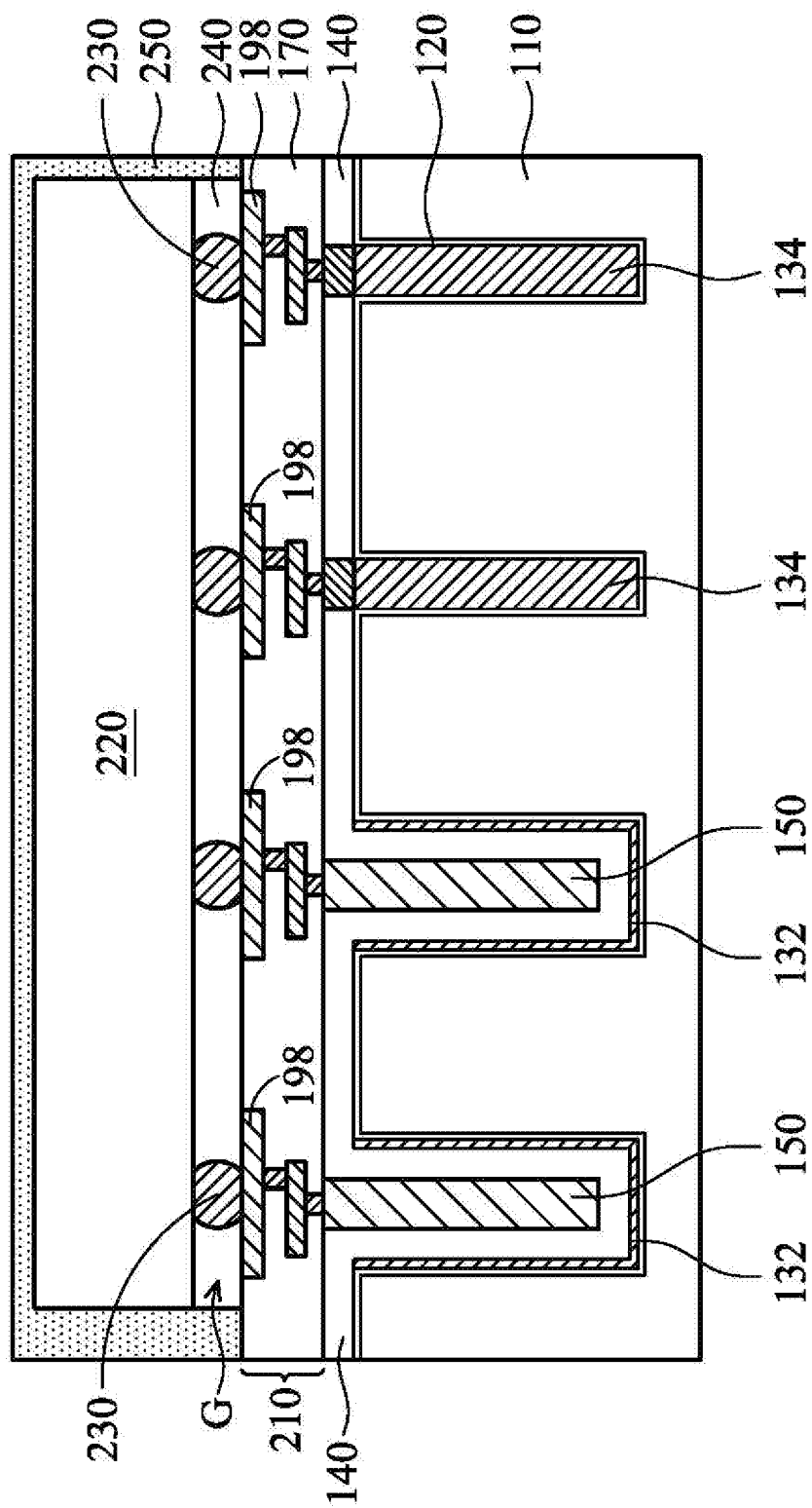
Figure 1L:
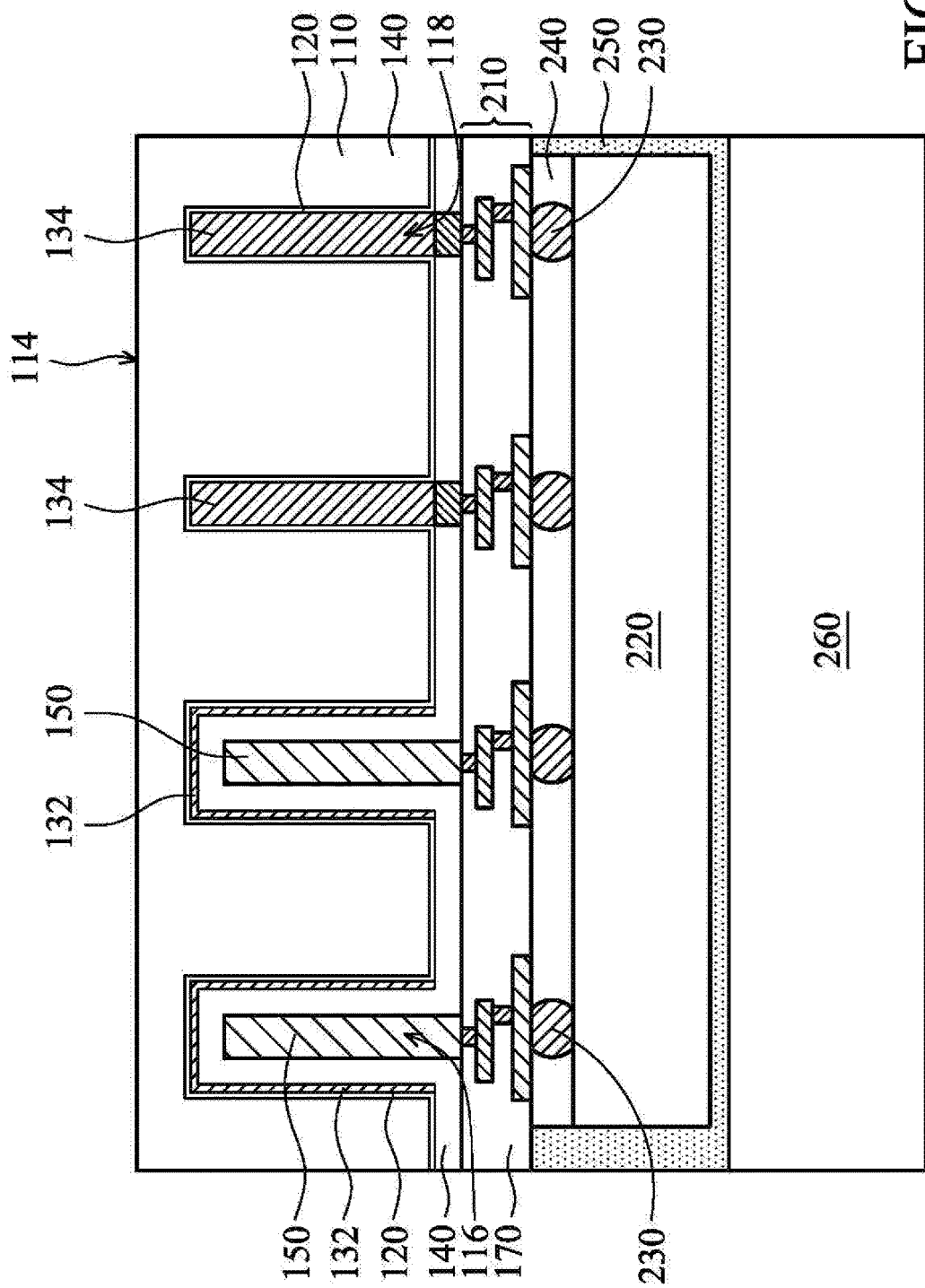
Figure 1M:
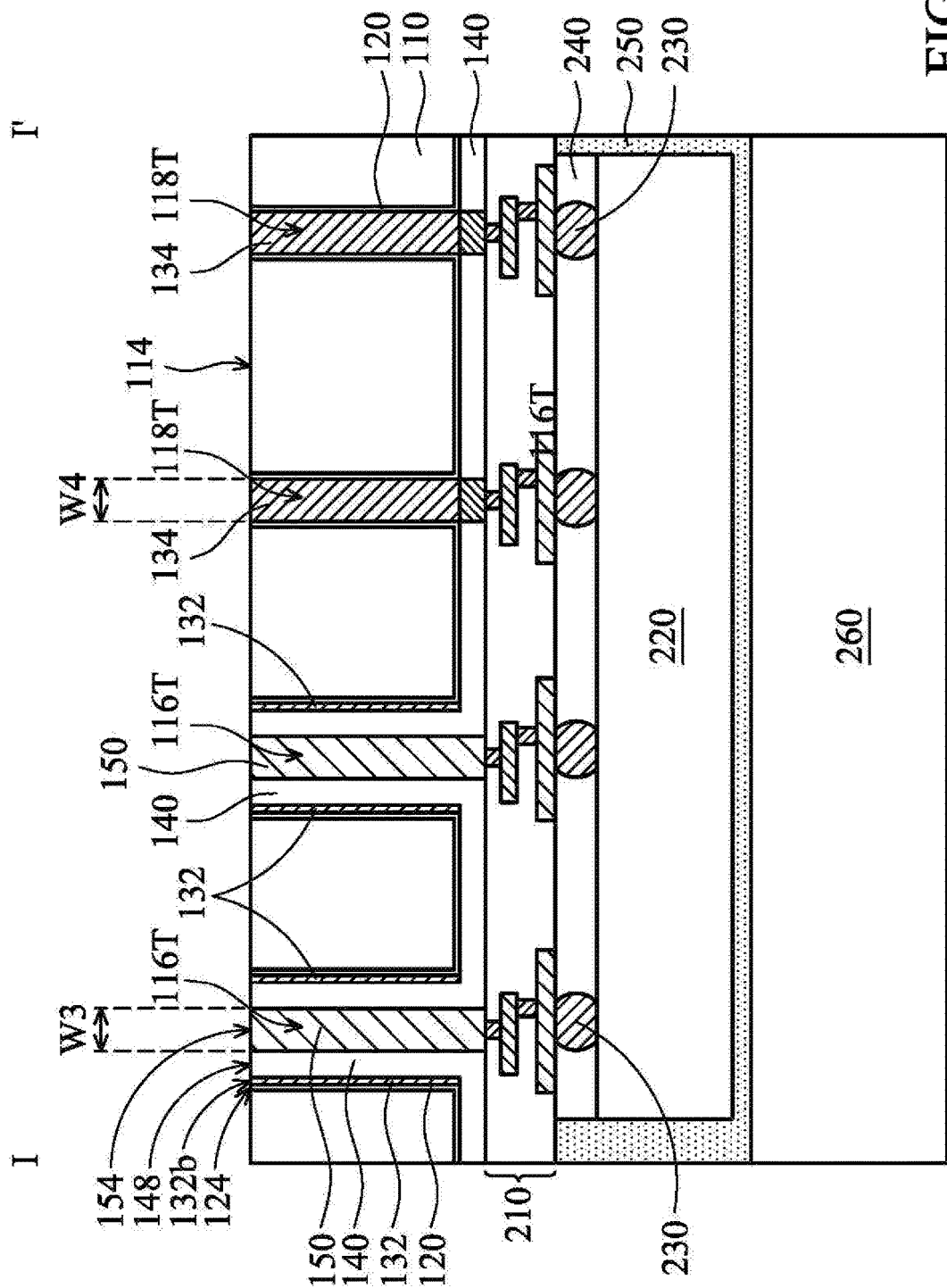
FIG. 1M-1 is a top view of a portion of the semiconductor device structure of FIG. 1M, in accordance with some embodiments.
Figures 1, 1M:
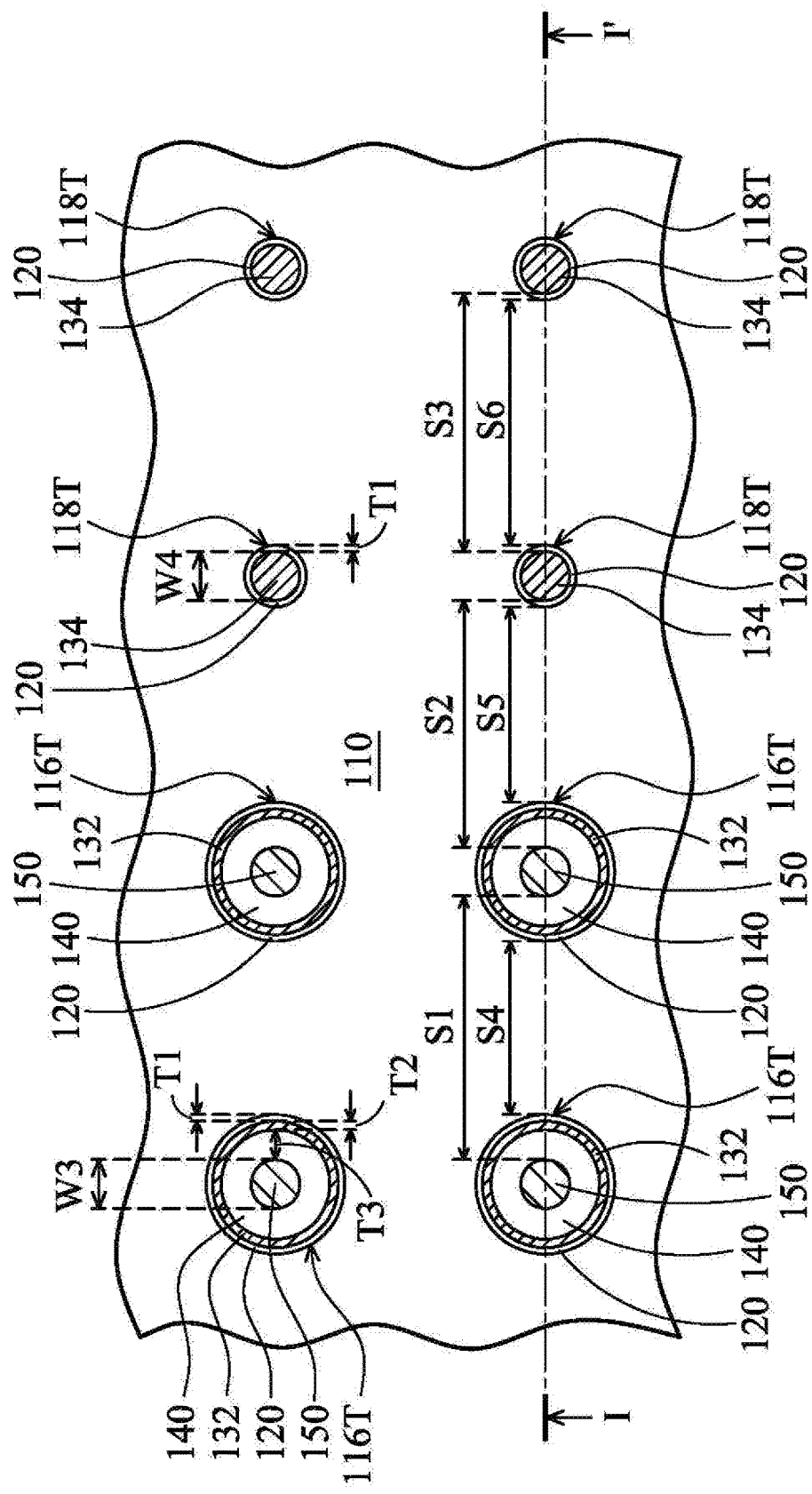
Figure 1N:
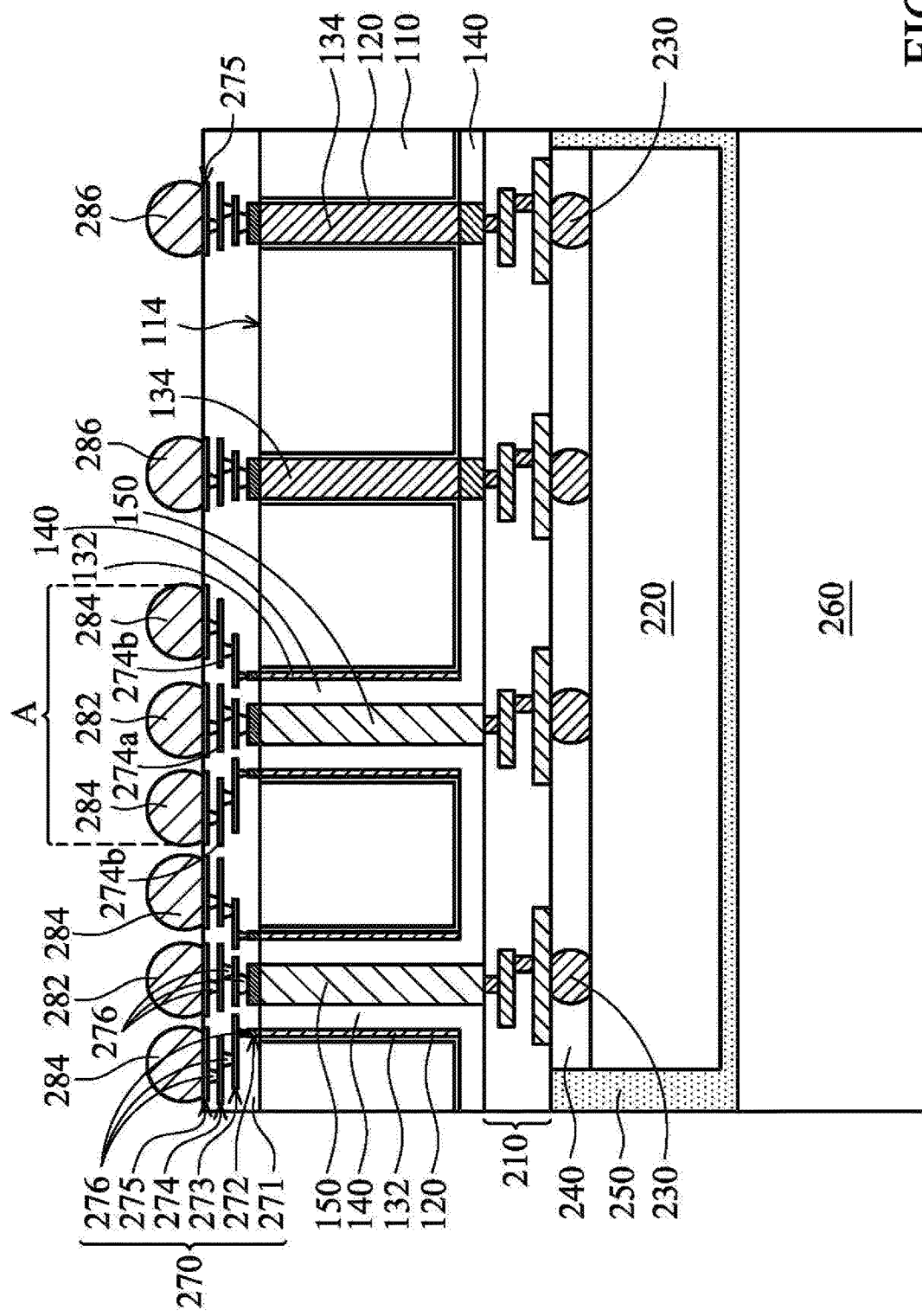
Figures 1, 1N:
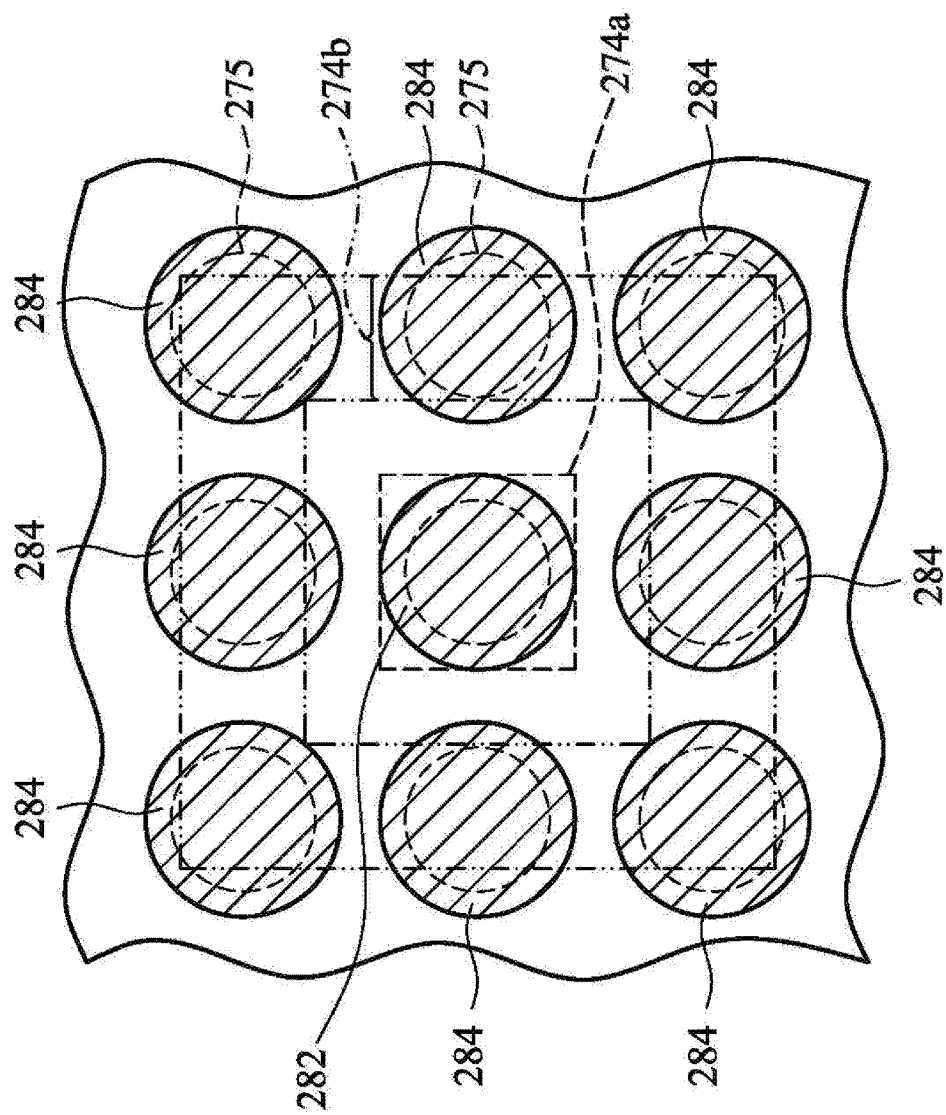
Figure 1O:
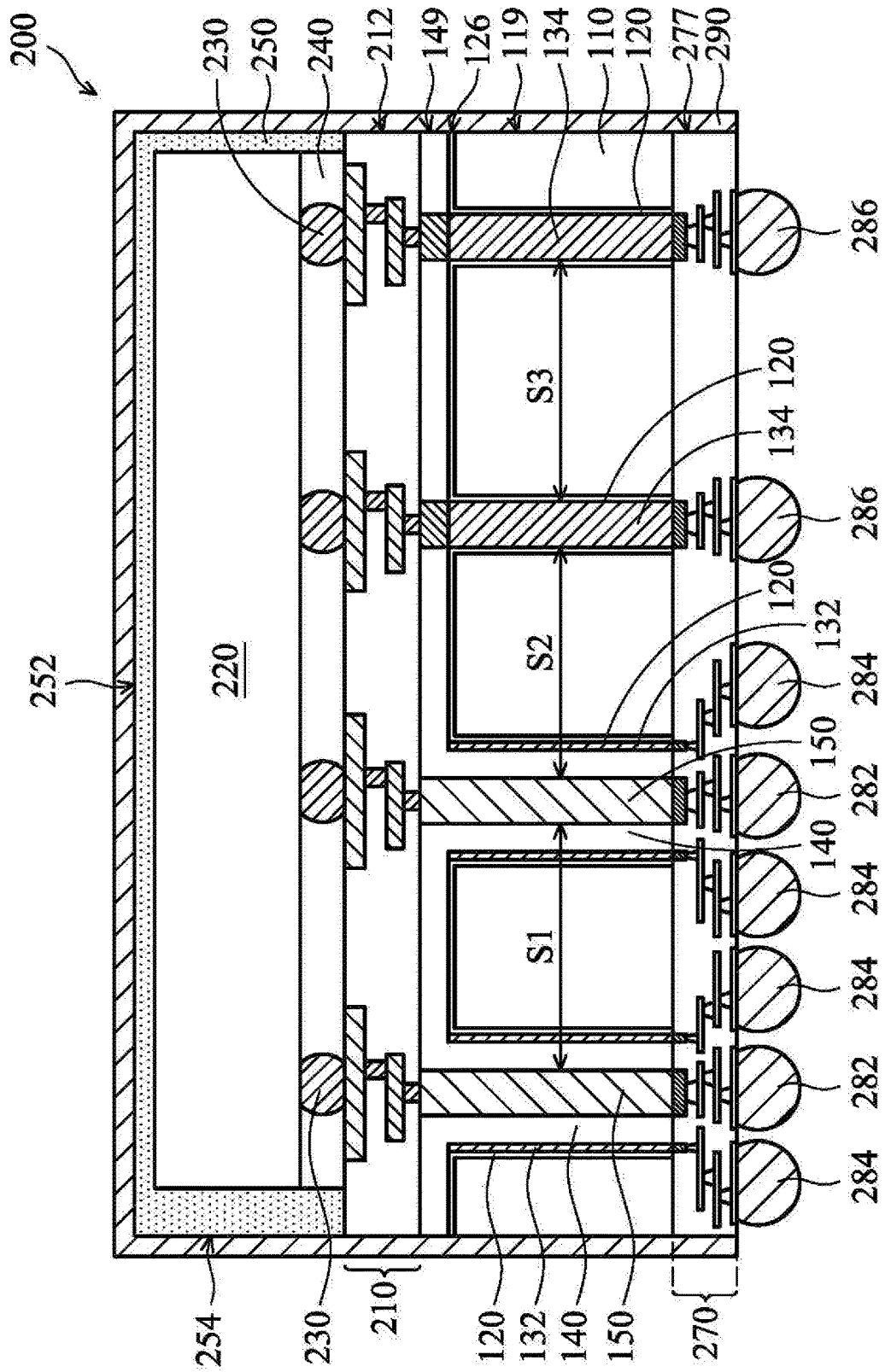

FIGS. 1A-1O are cross-sectional views of various stages of a process for forming a semiconductor device structure, in accordance with some embodiments. The semiconductor device structure may be a semiconductor substrate with through substrate vias or a chip package structure.

As shown in FIG. 1A, a substrate 110 is provided, in accordance with some embodiments. The substrate 110 has opposite surfaces 112 and 114, in accordance with some embodiments. The substrate 110 is made of an elementary semiconductor material including silicon or germanium in a single crystal, polycrystal, or amorphous structure.

In some other embodiments, the substrate 110 is made of a compound semiconductor (e.g., silicon carbide, gallium arsenide, gallium phosphide, indium phosphide, or indium arsenide), an alloy semiconductor (e.g., SiGe, or GaAsP), or a combination thereof. The substrate 110 may also include multi-layer semiconductors, semiconductor on insulator (SOI) (such as silicon on insulator or germanium on insulator), or a combination thereof.

As shown in FIG. 1B, portions of the substrate 110 are removed from the surface 112 to form first holes 116 and second holes 118 in the surface 112, in accordance with some embodiments. In some embodiments, a width W1 of each first hole 116 is greater than a width W2 of each second hole 118.

In some embodiments, the width W1 is a maximum width of each first hole 116, and the width W2 is a maximum width of each second hole 118. In some embodiments, an average width of each first hole 116 is greater than an average width of each second hole 118. The removal process includes an etching process, such as a dry etching process, in accordance with some embodiments.

As shown in FIG. 1B, an insulating layer 120 is formed over the substrate 110 and in the first holes 116 and the second holes 118, in accordance with some embodiments. The insulating layer 120 conformally covers the surface 112, inner walls 116a and bottom surfaces 116b of the first holes 116, and inner walls 118a and bottom surfaces 118b of the second holes 118, in accordance with some embodiments. The insulating layer 120 is also referred to as a liner layer, in accordance with some embodiments.

The insulating layer 120 has a thickness T1 ranging from about 0.1 μm to about 0.2 μm, in accordance with some embodiments. The insulating layer 120 includes oxide (such as silicon oxide), in accordance with some embodiments. The insulating layer 120 is formed using a thermal oxidation process or a chemical vapor deposition process, in accordance with some embodiments.

As shown in FIG. 1C, a conductive layer 130 is formed over the insulating layer 120 and in the first holes 116 and the second holes 118, in accordance with some embodiments. The conductive layer 130 conformally covers the insulating layer 120 in the first holes 116 and the insulating layer 120 over the surface 112, in accordance with some embodiments.

Therefore, the conductive layer 130 has recesses 131 respectively in the first holes 116, in accordance with some embodiments. The conductive layer 130 fills the second holes 118, in accordance with some embodiments. Therefore, the conductive layer 130 does not have recesses in the second holes 118, in accordance with some embodiments.

The conductive layer 130 is made of a metal material or an alloy material, in accordance with some embodiments. The metal material includes copper, gold, aluminum, tungsten, or another suitable metal material. The formation of the conductive layer 130 includes: forming a seed layer (not shown) over the insulating layer 120; and plating a conductive material layer (not shown) over the seed layer, in accordance with some embodiments. The plating of the conductive material layer includes an electroplating plating process, in accordance with some embodiments.

As shown in FIG. 1D, the conductive layer 130 over the surface 112 is removed, in accordance with some embodiments. The conductive layer 130 remaining in each first hole 116 forms a conductive shielding structure 132, in accordance with some embodiments. The conductive layer 130 remaining in each second hole 118 forms a conductive structure 134, in accordance with some embodiments.

The conductive shielding structures 132 and the conductive structures 134 are electrically insulated from each other after the removing of the conductive layer 130 over the surface 112, in accordance with some embodiments. The conductive shielding structures 132 and the conductive structures 134 are electrically insulated from the substrate 110 by the insulating layer 120 therebetween, in accordance with some embodiments.

The removal process includes performing a planarization process over the conductive layer 130 until the insulating layer 120 over the surface 112 is exposed, in accordance with some embodiments. The planarization process includes a chemical mechanical polishing (CMP) process, in accordance with some embodiments. In some embodiments, top surfaces 132a, 122, and 134a of the conductive shielding structures 132, the insulating layer 120, and the conductive structures 134 are coplanar after the removal process.

As shown in FIG. 1E, an insulating layer 140 is formed over the conductive shielding structures 132, the conductive structures 134, and the surface 112, in accordance with some embodiments. The insulating layer 140 conformally covers the conductive shielding structures 132, the conductive structures 134, and the surface 112, in accordance with some embodiments. Therefore, the insulating layer 140 has recesses 142 respectively in the recesses 131, in accordance with some embodiments.

The conductive shielding structures 132 (or the conductive layer 130) have a thickness T2, in accordance with some embodiments. The insulating layer 140 has a thickness T3, in accordance with some embodiments. The thickness T3 is greater than the thickness T2, in accordance with some embodiments. The thickness T2 is greater than the thickness T1 of the insulating layer 120, in accordance with some embodiments.

In some embodiments, an average thickness of the insulating layer 140 is greater than an average thickness of the conductive shielding structures 132 (or the conductive layer 130). In some embodiments, an average thickness of the conductive shielding structures 132 (or the conductive layer 130) is greater than an average thickness of the insulating layer 120.

The insulating layer 140 is made of a high-k material, such as hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

The insulating layer 140 is made of an oxide material, such as silicon oxide. The insulating layer 140 is made of a polymer material, such as polyimide, polybenzoxazole (PBO), benzocyclobutene (BCB), or the like. The insulating layer 140 is formed using a deposition process, such as a chemical vapor deposition process, in accordance with some embodiments.

As shown in FIG. 1F, a conductive layer 150a is formed over the insulating layer 140, in accordance with some embodiments. The recesses 142 are filled with the conductive layer 150a, in accordance with some embodiments. The conductive layer 150a is made of copper, gold, aluminum, tungsten, or another suitable conductive material, in accordance with some embodiments.

The formation of the conductive layer 150a includes forming a seed layer (not shown) over the insulating layer 140; and plating a conductive material layer (not shown) over the seed layer, in accordance with some embodiments. In some other embodiments, the conductive layer 150a is formed using a physical vapor deposition process.

As shown in FIG. 1G, the conductive layer 150a outside of the recesses 142 is removed, in accordance with some embodiments. The conductive layer 150a remaining in each recess 142 forms a conductive structure 150, in accordance with some embodiments.

The conductive layer 150a outside of the recesses 142 is removed using a planarization process, such as a chemical mechanical polishing process, in accordance with some embodiments. Therefore, top surfaces 152 of the conductive structures 150 and a top surface 144 of the insulating layer 140 are coplanar, in accordance with some embodiments.

As shown in FIG. 1H, portions of the insulating layer 140 are removed to form openings 146 in the insulating layer 140, in accordance with some embodiments. The openings 146 expose the top surfaces 134a of the conductive structures 134, in accordance with some embodiments. The portions of the insulating layer 140 are removed using a photolithography process and an etching process, in accordance with some embodiments.

As shown in FIG. 1H, a conductive layer 160 is formed in the openings 146, in accordance with some embodiments. The conductive layer 160 is electrically connected to the conductive structures 134 thereunder, in accordance with some embodiments. The conductive layer 160 is in direct contact with the conductive structures 134 thereunder, in accordance with some embodiments.

The formation of the conductive layer 160 includes forming a seed layer (not shown) over the conductive structures 134 and the insulating layer 140; plating a conductive material layer (not shown) over the seed layer; and performing a planarization process over the conductive material layer until the top surface 144 of the insulating layer 140 is exposed, in accordance with some embodiments.

The planarization process includes a chemical mechanical polishing (CMP) process, in accordance with some embodiments. Therefore, the top surfaces 162, 144, and 152 of the conductive layer 160, the insulating layer 140, and the conductive structures 150 are coplanar, in accordance with some embodiments.

As shown in FIG. 1I, a dielectric layer 172 is formed over the insulating layer 140 and the conductive layer 160, in accordance with some embodiments. The dielectric layer 172 is made of a polymer material (e.g., polyimide, PBO, or the like), in accordance with some embodiments. In some embodiments, the dielectric layer 172 is made of oxide, such as silicon dioxide or high-density plasma oxide. In some embodiments, the dielectric layer 172 is made of borophosphosilicate glass (BPSG), spin on glass (SOG), undoped silicate glass (USG), fluorinated silicate glass (FSG), plasma-enhanced TEOS (PETEOS), the like, or the combination thereof.

The dielectric layer 172 and the insulating layer 140 are made of different materials, in accordance with some embodiments. In some other embodiments, the dielectric layer 172 and the insulating layer 140 are made of the same material. The dielectric layer 172 is formed using a coating process, in accordance with some embodiments.

As shown in FIG. 1I, a mask layer 182 is formed over the dielectric layer 172, in accordance with some embodiments. The mask layer 182 has openings 182a expose portions of the dielectric layer 172, in accordance with some embodiments. The mask layer 182 is made of a photoresist material, in accordance with some embodiments.

As shown in FIG. 1J, the portions of the dielectric layer 172 are removed through the openings 182a to form openings 172a in the dielectric layer 172, in accordance with some embodiments. As shown in FIG. 1J, conductive via structures 192 are formed in the openings 172a, in accordance with some embodiments.

Some of the conductive via structures 192 are in direct contact with the conductive structures 150 thereunder, in accordance with some embodiments. Some of the conductive via structures 192 are in direct contact with the conductive structures 134 thereunder, in accordance with some embodiments. The conductive via structures 192 are made of copper, aluminum, or another suitable conductive material.

The formation of the conductive via structures 192 includes forming a conductive material layer (not shown) over the dielectric layer 172 to fill the openings 172a; and performing a planarization process over the conductive material layer until the dielectric layer 172 is exposed, in accordance with some embodiments. That is, the conductive via structures 192 are formed using a single damascene process, in accordance with some embodiments.

As shown in FIG. 1J, a dielectric layer 174 is formed over the dielectric layer 172, in accordance with some embodiments. The dielectric layer 174 is made of a polymer material (e.g., polyimide, PBO, or the like), in accordance with some embodiments. In some embodiments, the dielectric layer 174 is made of oxide, such as silicon dioxide or high-density plasma oxide. In some embodiments, the dielectric layer 174 is made of borophosphosilicate glass (BPSG), spin on glass (SOG), undoped silicate glass (USG), fluorinated silicate glass (FSG), plasma-enhanced TEOS (PETEOS), the like, or the combination thereof.

As shown in FIG. 1J, conductive lines 194 are formed in the dielectric layer 174, in accordance with some embodiments. The conductive lines 194 are electrically connected to the conductive via structures 192, in accordance with some embodiments. The conductive lines 194 are in direct contact with the conductive via structures 192 thereunder, in accordance with some embodiments. The conductive lines 194 are made of copper, aluminum, or another suitable conductive material. The conductive lines 194 are formed using a single damascene process, in accordance with some embodiments.

As shown in FIG. 1J, a dielectric layer 176 is formed over the dielectric layer 174 and the conductive lines 194, in accordance with some embodiments. The dielectric layer 176 is made of a polymer material (e.g., polyimide, PBO, or the like), in accordance with some embodiments. In some embodiments, the dielectric layer 176 is made of oxide, such as silicon dioxide or high-density plasma oxide. In some embodiments, the dielectric layer 176 is made of borophosphosilicate glass (BPSG), spin on glass (SOG), undoped silicate glass (USG), fluorinated silicate glass (FSG), plasma-enhanced TEOS (PETEOS), the like, or the combination thereof.

As shown in FIG. 1J, conductive via structures 196 are formed in the dielectric layer 176, in accordance with some embodiments. The conductive via structures 196 are electrically connected to the conductive lines 194, in accordance with some embodiments. The conductive via structures 196 are in direct contact with the conductive lines 194 thereunder, in accordance with some embodiments. The conductive via structures 196 are made of copper, aluminum, or another suitable conductive material. The conductive via structures 196 are formed using a single damascene process, in accordance with some embodiments.

As shown in FIG. 1J, a dielectric layer 178 is formed over the dielectric layer 176, in accordance with some embodiments. The dielectric layer 178 is made of a polymer material (e.g., polyimide, PBO, or the like), in accordance with some embodiments. In some embodiments, the dielectric layer 178 is made of oxide, such as silicon dioxide or high-density plasma oxide. In some embodiments, the dielectric layer 178 is made of borophosphosilicate glass (BPSG), spin on glass (SOG), undoped silicate glass (USG), fluorinated silicate glass (FSG), plasma-enhanced TEOS (PETEOS), the like, or the combination thereof.

As shown in FIG. 1J, conductive pads 198 are formed in the dielectric layer 178, in accordance with some embodiments. The conductive pads 198 are electrically connected to the conductive via structures 196, in accordance with some embodiments. The conductive pads 198 are in direct contact with the conductive via structures 196 thereunder, in accordance with some embodiments. The conductive pads 198 are made of copper, aluminum, or another suitable conductive material. The conductive pads 198 are formed using a single damascene process, in accordance with some embodiments.

The dielectric layers 172, 174, 176, and 178 together form a dielectric structure 170, in accordance with some embodiments. The conductive via structures 192 and 196, the conductive lines 194, the conductive pads 198, and the dielectric structure 170 together form an interconnection structure 210, in accordance with some embodiments.

In some other embodiments, the conductive via structures 192 and 196, the conductive lines 194, and the conductive pads 198 are formed using dual damascene processes. In still some other embodiments, the dielectric layer 172 is made of a photosensitive material, and the formation of the dielectric layer 172 and the conductive via structures 192 includes forming a photosensitive material layer (not shown) over the insulating layer 140 and the conductive layer 160; performing a photolithography process to form the openings 172a; forming a conductive material layer (not shown) over the dielectric layer 172 to fill the openings 172a; and performing a planarization process over the conductive material layer until the dielectric layer 172 is exposed, in accordance with some embodiments.

The dielectric layers 174, 176, and 178, the conductive lines 194, the conductive via structures 196, and the conductive pads 198 may be formed using the processes similar to the aforementioned processes for forming the dielectric layer 172 and the conductive via structures 192, in accordance with some embodiments.

As shown in FIG. 1K, a chip 220 is bonded to the interconnection structure 210 through conductive bumps 230 between the chip 220 and the conductive pads 198, in accordance with some embodiments. The chip 220 is electrically connected to the conductive structures 150 and 134 through the conductive bumps 230 and the interconnection structure 210, in accordance with some embodiments.

The chip 220 is a high frequency chip, such as a radio frequency (RF) chip, a graphic processor unit (GPU) chip, or another suitable high frequency chip. The chip 220 generates a signal having a frequency ranging from about 1 GHz to about 60 GHz, in accordance with some embodiments.

As shown in FIG. 1K, an underfill layer 240 is formed in the gap G between the chip 220 and the interconnection structure 210, in accordance with some embodiments. The underfill layer 240 is made of an insulating material, such as a polymer material, in accordance with some embodiments.

As shown in FIG. 1K, a molding layer 250 is formed over the interconnection structure 210, in accordance with some embodiments. The molding layer 250 covers the chip 220 and surrounds the chip 220, the underfill layer 240, and the conductive bumps 230, in accordance with some embodiments.

The molding layer 250 is made of an insulating material, such as a polymer material, in accordance with some embodiments. In some embodiments, the molding layer 250 and the underfill layer 240 are made of different materials. In some embodiments, the molding layer 250 and the underfill layer 240 are made of the same material.

As shown in FIG. 1L, the molding layer 250 is bonded to a carrier substrate 260 and flipped upside down, in accordance with some embodiments. The carrier substrate 260 is configured to provide temporary mechanical and structural support during subsequent processing steps, in accordance with some embodiments. The carrier substrate 260 includes glass, silicon oxide, aluminum oxide, metal, a combination thereof, and/or the like, in accordance with some embodiments.

As shown in FIG. 1M, the substrate 110, the insulating layer 120 in the first holes 116 and the second holes 118, the conductive shielding structures 132, the conductive structures 134 and 150, the insulating layer 140 in the first holes 116 are partially removed from the surface 114 of the substrate 110 to expose the conductive structures 134 and 150, in accordance with some embodiments.

After the removal process, the first holes 116 become first through holes 116T, and the second holes 118 become second through holes 118T, in accordance with some embodiments. The conductive structures 150 respectively pass through the first through holes 116T, in accordance with some embodiments. The conductive structures 134 respectively pass through the second through holes 118T, in accordance with some embodiments.

The removal process includes a planarization process, such as a chemical mechanical polishing process, in accordance with some embodiments. Therefore, the surfaces 154, 148, 132b, 124, and 114 of the conductive structures 150, the insulating layer 140, the conductive shielding structures 132, the insulating layer 120, and the substrate 110 are coplanar, in accordance with some embodiments. The conductive shielding structures 132 are electrically insulated from the conductive structures 134 and 150 and the chip 220, in accordance with some embodiments.

FIG. 1M-1 is a top view of a portion of the semiconductor device structure of FIG. 1M, in accordance with some embodiments. FIG. 1M is a cross-sectional view illustrating the semiconductor device structure along a sectional line I-I' in FIG. 1M-1, in accordance with some embodiments.

As shown in FIGS. 1M and 1M-1, the insulating layer 140 is in the first through hole 116T and continuously surrounds the conductive structure 150, in accordance with some embodiments. The conductive shielding structure 132 is in the first through hole 116T and continuously surrounds the insulating layer 140, in accordance with some embodiments.

The insulating layer 120 is in the first through hole 116T and continuously surrounds the conductive shielding structure 132, in accordance with some embodiments. The insulating layer 120 is in the second through hole 118T and continuously surrounds the conductive structure 134, in accordance with some embodiments.

As shown in FIGS. 1M and 1M-1, the conductive shielding structure 132 in one of the first through holes 116T is tube-shaped, in accordance with some embodiments. In one of the first through holes 116T, the insulating layer 140, the conductive shielding structure 132, and the insulating layer 120 are tube structures, which are concentric to each other, in accordance with some embodiments. The tube structures are concentric about the conductive structure 150, in accordance with some embodiments.

In some embodiments, a width W3 of each conductive structure 150 is substantially equal to a width W4 of each conductive structure 134. The term "substantially equal to" means "within 10%", in accordance with some embodiments. For example, the term "substantially equal to" means "the difference between the widths W3 and W4 is within 10% of the width W3 or W4", in accordance with some embodiments.

In some embodiments, a distance S1 between two adjacent conductive structures 150, a distance S2 between the adjacent conductive structures 150 and 134, and a distance S3 between two adjacent conductive structures 134 are substantially equal to each other.

In some embodiments, a distance S4 between two adjacent first through holes 116T is less than a distance S5 between the adjacent through holes 116T and 118T, and the distance S5 is less than a distance S6 between two adjacent second through holes 118T.

As shown in FIG. 1N, an interconnection structure 270 is formed over the surface 114 of the substrate 110, in accordance with some embodiments. The interconnection structure 270 includes a dielectric structure 271, wiring layers 272, 273, and 274, conductive pads 275, and conductive via structures 276, in accordance with some embodiments.

The wiring layers 272, 273, and 274, the conductive pads 275, and the conductive via structures 276 are formed in the dielectric structure 271, in accordance with some embodiments. The wiring layers 272, 273, and 274 and the conductive pads 275 are electrically connected to the each other through the conductive via structures 276 therebetween, in accordance with some embodiments.

The wiring layers 272, 273, and 274, the conductive pads 275, and the conductive via structures 276 are electrically connected to the conductive structures 134 and 150 and the conductive shielding structures 132, in accordance with some embodiments.

The wiring layer 274 includes conductive lines 274a and 274b, in accordance with some embodiments. The conductive line 274a is electrically connected to the conductive structure 150, in accordance with some embodiments. The conductive line 274b is electrically connected to the conductive shielding structure 132, in accordance with some embodiments. The conductive line 274a is electrically insulated from the conductive line 274b, in accordance with some embodiments.

FIG. 1N-1 is a top view of the region A of the semiconductor device structure of FIG. 1N, in accordance with some embodiments. As shown in FIGS. 1N and 1N-1, the conductive line 274b continuously surrounds the entire conductive line 274a to reduce signal interference between the conductive line 274a and adjacent conductive lines of the wiring layer 274, in accordance with some embodiments. The wiring layers 272, 273, and 274, the conductive pads 275, and the conductive via structures 276 are formed using single damascene processes, in accordance with some embodiments.

As shown in FIGS. 1N and 1N-1, conductive bumps 282 and 286 and ground bumps 284 are formed over the interconnection structure 270, in accordance with some embodiments. The conductive bumps 282 and 286 and ground bumps 284 are respectively positioned over the conductive pads 275, in accordance with some embodiments. The conductive bumps 282 are respectively electrically connected to the conductive structures 150 through the conductive pads 275, the wiring layers 272, 273, and 274, and the conductive via structures 276, in accordance with some embodiments.

The ground bumps 284 are respectively electrically connected to the conductive shielding structures 132 through the conductive pads 275, the wiring layers 272, 273, and 274, and the conductive via structures 276, in accordance with some embodiments. The conductive bumps 286 are respectively electrically connected to the conductive structures 134 through the conductive pads 275, the wiring layers 272, 273, and 274, and the conductive via structures 276, in accordance with some embodiments.

As shown in FIGS. 1N and 1N-1, the ground bumps 284 surround the conductive bump 282 and are electrically connected to the conductive line 274b, in accordance with some embodiments. The conductive bump 282 is electrically connected to the conductive line 274a, in accordance with some embodiments. The ground bumps 284 are electrically insulated from the conductive bump 282, in accordance with some embodiments.

As shown in FIG. 1O, the substrate 110 is flipped upside down and the carrier substrate 260 is removed, in accordance with some embodiments. As shown in FIG. 1O, a dicing process is performed to cut the interconnection structures 210 and 270, the substrate 110, the insulating layers 120 and 140, and the molding layer 250 into individual semiconductor device structures 200, in accordance with some embodiments.

For the sake of simplicity, FIG. 1O only shows one of the semiconductor device structures 200, in accordance with some embodiments. The semiconductor device structures 200 are also referred to as chip package structures, in accordance with some embodiments.

As shown in FIG. 1O, after the dicing process, a conductive shielding layer 290 is formed over the molding layer 250, the interconnection structures 210 and 270, the substrate 110, the insulating layers 120 and 140, in accordance with some embodiments.

The conductive shielding layer 290 covers a top surface 252 of the molding layer 250 and sidewalls 254, 212, 149, 126, 119, and 277 of the molding layer 250, the interconnection structure 210, the insulating layer 140, the insulating layer 120, the substrate 110, and the interconnection structure 270, in accordance with some embodiments.

The conductive shielding layer 290 is configured to reduce signal interference between the semiconductor device structure 200 and other semiconductor device structures adjacent to the semiconductor device structure 200, in accordance with some embodiments. The conductive shielding layer 290 is electrically insulated from the chip 220, the conductive shielding structures 132, and the conductive structures 134 and 150, in accordance with some embodiments.

The sidewalls 254, 212, 149, 126, 119, and 277 are coplanar, in accordance with some embodiments. The conductive shielding layer 290 is made of a metal material or an alloy material, in accordance with some embodiments. The metal material includes copper, gold, aluminum, tungsten, or another suitable metal material. The conductive shielding layer 290 is formed using a physical vapor deposition process or a plating process, in accordance with some embodiments.

The conductive structures 150 are configured to transmit signals with high frequencies (e.g., frequencies greater than 1 GHz), in accordance with some embodiments. The conductive structures 134 are configured to transmit signals with frequencies lower than that of the signals transmitted by the conductive structures 150, in accordance with some embodiments. The conductive shielding structures 132 are configured to reduce signal interference between the conductive structures 150 and/or between the conductive structures 150 and 134, in accordance with some embodiments.

Since the conductive shielding structures 132 reduce signal interference, the distance S1 between two adjacent conductive structures 150, the distance S2 between the adjacent conductive structures 150 and 134, and the distance S3 between two adjacent conductive structures 134 are able to be maintained substantially equal to each other. That is, there is no need to increase the distances S1 and S2 to reduce signal interference. Therefore, the formation of the conductive shielding structures 132 may reduce the sizes of the substrate 110 and the semiconductor device structures 200. In some other embodiments, according to design requirements, at least two of the distance S1, S2, or S3 are different from each other.

Figure 2:
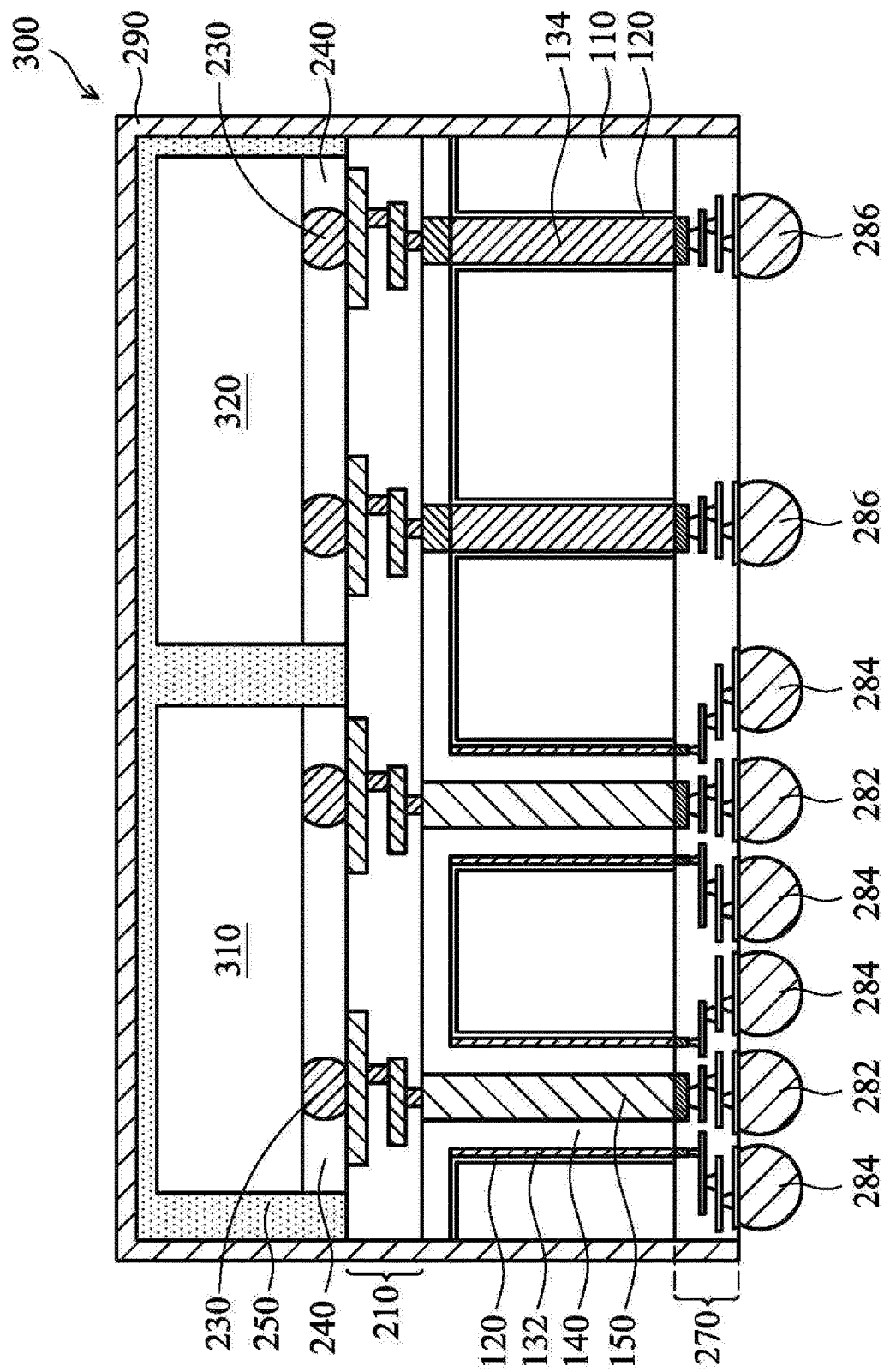
FIG. 2 is a cross-sectional view of a semiconductor device structure, in accordance with some embodiments.

FIG. 2 is a cross-sectional view of a semiconductor device structure 300, in accordance with some embodiments. As shown in FIG. 2, a semiconductor device structure 300 is similar to the semiconductor device structure 200 of FIG. 1O, except that the semiconductor device structure 300 has chips 310 and 320 and does not have the chip 220 of the semiconductor device structure 200 of FIG. 1O, in accordance with some embodiments.

The chip 310 is electrically connected to the conductive structures 150, in accordance with some embodiments. The chip 320 is electrically connected to the conductive structures 134, in accordance with some embodiments. The chip 310 is a high frequency chip, such as a radio frequency (RF) chip, a graphic processor unit (GPU) chip, or another suitable high frequency chip.

The chip 320 is a low frequency chip or another suitable chip. The chip 320 generates a signal with a frequency lower than a frequency of a signal generated by the chip 310, in accordance with some embodiments. The semiconductor device structure 300 is also referred to as a chip package structure, in accordance with some embodiments.

Figure 3A:
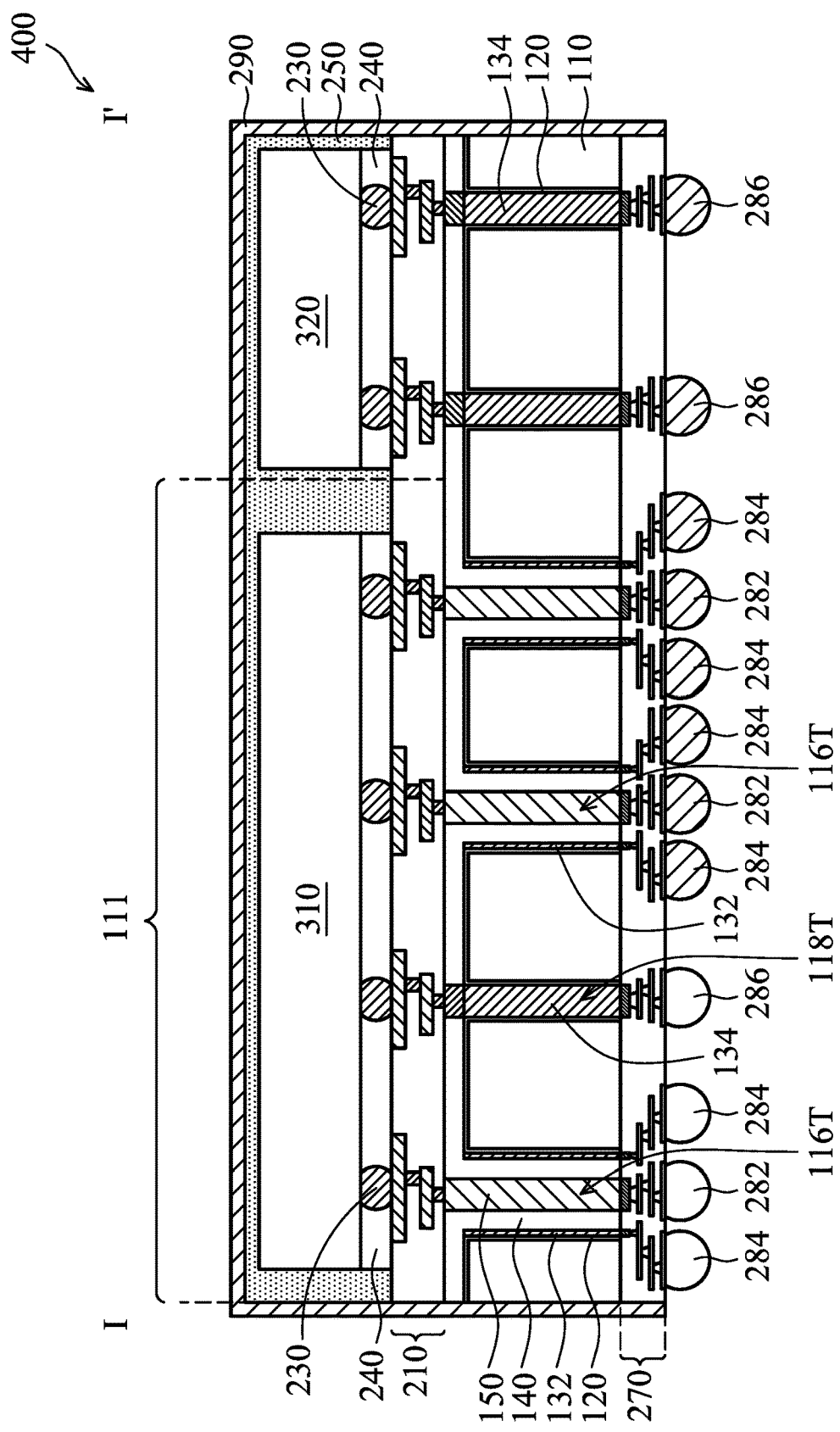
FIG. 3A is a cross-sectional view of a semiconductor device structure, in accordance with some embodiments.
Figure 3B:
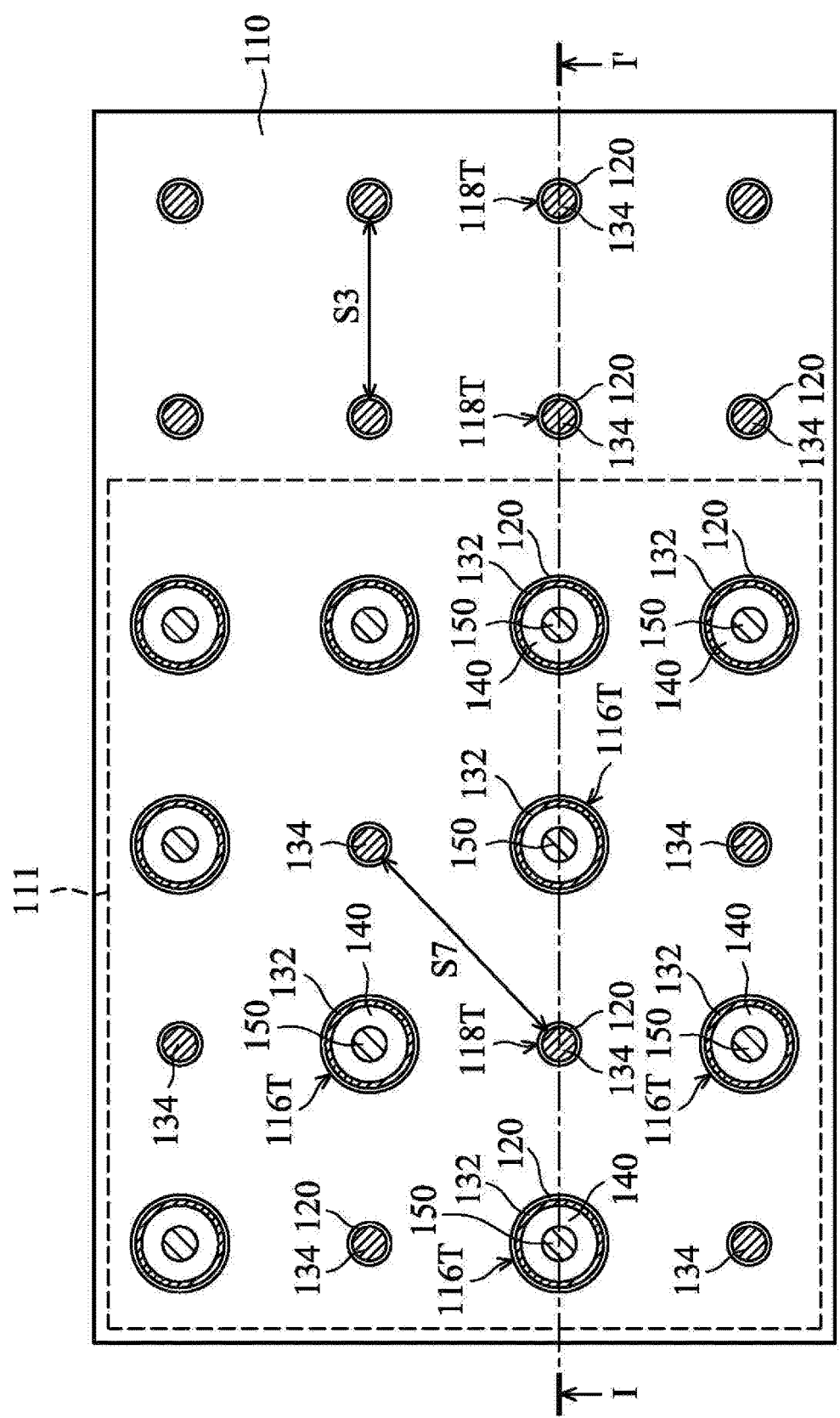
FIG. 3B is a bottom view of the substrate of the semiconductor device structure of FIG. 3A, in accordance with some embodiments.

FIG. 3A is a cross-sectional view of a semiconductor device structure 400, in accordance with some embodiments. FIG. 3B is a bottom view of the substrate 110 of the semiconductor device structure 400 of FIG. 3A, in accordance with some embodiments. FIG. 3A is a cross-sectional view illustrating the semiconductor device structure 400 along a sectional line I-I' in FIG. 3B, in accordance with some embodiments.

As shown in FIGS. 3A and 3B, a semiconductor device structure 400 is similar to the semiconductor device structure 300 of FIG. 2, except that the semiconductor device structure 400 has the second through hole 118T between the first through holes 116T, in accordance with some embodiments. That is, the conductive structure 134 in the second through hole 118T is between the conductive shielding structures 132 respectively in the first through holes 116T, in accordance with some embodiments.

The substrate 110 has a high frequency region 111, in accordance with some embodiments. High frequency elements (e.g., high frequency chips) may be formed in the high frequency region 111. In the high frequency region 111, the first through holes 116T and the second through holes 118T are alternately arranged, in accordance with some embodiments.

In the high frequency region 111, the conductive structures 134 and the conductive shielding structures 132 are alternately arranged, in accordance with some embodiments. The conductive shielding structures 132 surround one of the conductive structures 134, in accordance with some embodiments. The conductive structures 134 surround one of the conductive shielding structures 132, in accordance with some embodiments.

Since the distance S7 between the conductive structures 134 in the high frequency region 111 is greater than the distance S3 between the conductive structures 134 outside of the high frequency region 111, the distance S7 may reduce signal interference between the conductive structures 134 in the high frequency region 111. The semiconductor device structure 400 is also referred to as a chip package structure, in accordance with some embodiments.

In accordance with some embodiments, semiconductor device structures and methods for forming the same are provided. The methods (for forming the semiconductor device structure) form a conductive shielding structure in a substrate to surround a through substrate via so as to reduce signal interference between the through substrate via and other adjacent through substrate vias. Therefore, there is no need to increase distances between the through substrate vias to reduce signal interference. As a result, the formation of the conductive shielding structures may reduce the size of the substrate and the size of a chip package structure with the substrate.

In accordance with some embodiments, a method for forming a semiconductor device structure is provided. The method includes forming a first hole and a second hole in a first surface of a substrate. The method includes forming a first insulating layer in the first hole and the second hole. The method includes forming a conductive layer over the first insulating layer and in the first hole and the second hole. The conductive layer has a first recess in the first hole and fills the second hole. The method includes forming a second insulating layer over the conductive layer in the first recess. The second insulating layer has a second recess in the first recess. The method includes forming a conductive structure in the second recess. The method includes partially removing the substrate, the first insulating layer, the conductive layer, and the second insulating layer from a second surface of the substrate to expose the conductive structure and the conductive layer in the first hole and the second hole. The second surface is opposite to the first surface.

In accordance with some embodiments, a method for forming a semiconductor device structure is provided. The method includes forming a first hole and a second hole in a first surface of a substrate. The method includes conformally forming a first insulating layer in the first hole and the second hole. The method includes forming a conductive layer over the first insulating layer. The conductive layer conformally covers the first insulating layer in the first hole and has a first recess in the first hole, and the conductive layer fills the second hole. The method includes forming a second insulating layer over the conductive layer. The second insulating layer has a second recess in the first recess. The method includes forming a conductive structure in the second recess to fill the second recess. The method includes partially removing the substrate, the first insulating layer in the first hole and the second hole, the conductive layer in the first hole and the second hole, and the second insulating layer from a second surface of the substrate to expose the conductive structure and the conductive layer in the first hole and the second hole. The second surface is opposite to the first surface, and the conductive layer in the first hole forms a conductive shielding structure.

In accordance with some embodiments, a semiconductor device structure is provided. The semiconductor device structure includes a substrate. The semiconductor device structure includes a first conductive structure passing through the substrate. The semiconductor device structure includes a first insulating layer passing through the substrate and surrounding the first conductive structure. The semiconductor device structure includes a conductive shielding structure passing through the substrate and surrounding the first insulating layer. The semiconductor device structure includes a second insulating layer passing through the substrate and surrounding the conductive shielding structure. The semiconductor device structure includes a second conductive structure passing through the substrate. The second conductive structure and the conductive shielding structure are made of a same conductive material. The second conductive structure and the conductive shielding structure are made of a same conductive material. The semiconductor device structure includes a third insulating layer passing through the substrate and surrounding the second conductive structure. The third insulating layer and the second insulating layer are made of a same insulating material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a first hole and a second hole in a first surface of a substrate;
   forming a first insulating layer in the first hole and the second hole;

forming a conductive layer over the first insulating layer and in the first hole and the second hole, wherein the conductive layer has a first recess in the first hole and fills the second hole;

forming a second insulating layer over the conductive layer in the first recess, wherein the second insulating layer has a second recess in the first recess;

forming a conductive structure in the second recess, wherein the forming of the second insulating layer comprises:

conformally depositing the second insulating layer over the conductive layer and the first surface; and after forming the conductive structure, forming an opening in second insulating layer, wherein the opening exposes the conductive layer in the second hole; and partially removing the substrate, the first insulating layer, the conductive layer, and the second insulating layer from a second surface of the substrate to expose the conductive structure and the conductive layer in the first hole and the second hole, wherein the second surface is opposite to the first surface.

2. The method for forming the semiconductor device structure as claimed in claim 1, wherein the partially removing of the substrate, the first insulating layer, the conductive layer, and the second insulating layer comprises a planarization process.

3. The method for forming the semiconductor device structure as claimed in claim 1, wherein a first thickness of the second insulating layer is greater than a second thickness of the conductive layer, and the second thickness is greater than a third thickness of the first insulating layer.

4. The method for forming the semiconductor device structure as claimed in claim 1, wherein a first width of the first hole is greater than a second width of the second hole.

5. The method for forming the semiconductor device structure as claimed in claim 1, wherein the forming of the conductive layer comprises:

forming the conductive layer over the first insulating layer, wherein the conductive layer conformally covers the first insulating layer in the first hole and the first insulating layer over the first surface; and removing the conductive layer over the first surface.

6. The method for forming the semiconductor device structure as claimed in claim 5, wherein the removing of the conductive layer over the first surface comprises:

performing a planarization process over the conductive layer until the first insulating layer over the first surface is exposed.

7. The method for forming the semiconductor device structure as claimed in claim 1, wherein after partially removing the substrate, the first insulating layer, the conductive layer, and the second insulating layer from the second surface, the conductive layer in the first hole is tube-shaped and continuously surrounds the conductive structure.

8. The method for forming the semiconductor device structure as claimed in claim 1, further comprising:

after forming the conductive structure in the second recess and before partially removing the substrate, the first insulating layer, the conductive layer, and the second insulating layer from the second surface, forming an interconnection structure over the first surface, the conductive structure, and the conductive layer;

bonding a chip to the interconnection structure; and forming a molding layer over the interconnection structure to surround the chip.

9. A method for forming a semiconductor device structure, comprising:

forming a first hole and a second hole in a first surface of a substrate;

conformally forming a first insulating layer in the first hole and the second hole;

forming a conductive layer over the first insulating layer, wherein the conductive layer conformally covers the first insulating layer in the first hole and has a first recess in the first hole, and the conductive layer fills the second hole;

forming a second insulating layer over the conductive layer, wherein the second insulating layer has a second recess in the first recess;

forming a conductive structure in the second recess to fill the second recess; and partially removing the substrate, the first insulating layer in the first hole and the second hole, the conductive layer in the first hole and the second hole, and the second insulating layer from a second surface of the substrate to expose the conductive structure and the conductive layer in the first hole and the second hole, wherein the second surface is opposite to the first surface, the conductive layer in the first hole forms a conductive shielding structure, and the method further comprises:

after forming the conductive structure in the second recess and before the partially removing of the substrate, the first insulating layer in the first hole and the second hole, the conductive layer in the first hole and the second hole, and the second insulating layer from the second surface, forming a first interconnection structure over the first surface, the conductive structure, and the conductive layer;

bonding a chip to the first interconnection structure, wherein the chip is electrically connected to the conductive structure and the conductive layer in the second hole through the first interconnection structure, and the conductive layer in the first hole is electrically insulated from the conductive structure, the conductive layer in the second hole, and the chip; and forming a molding layer over the first interconnection structure to surround the chip.

10. The method for forming the semiconductor device structure as claimed in claim 9, further comprising:

after partially removing the substrate, the first insulating layer in the first hole and the second hole, the conductive layer in the first hole and the second hole, and the second insulating layer from the second surface, forming a second interconnection structure over the second surface, wherein the second interconnection structure comprises a dielectric structure, a first conductive line, and a second conductive line in the dielectric structure, the first conductive line and the second conductive line are respectively electrically connected to the conductive structure and the conductive shielding structure.

11. The method for forming the semiconductor device structure as claimed in claim 10, wherein the first conductive line is electrically insulated from the second conductive line, and the second conductive line continuously surrounds the entire first conductive line.

12. The method for forming the semiconductor device structure as claimed in claim 10, further comprising:

forming a conductive bump and a plurality of ground bumps over the second interconnection structure, wherein the conductive bump is electrically connected to the conductive structure, and the ground bumps are electrically connected to the conductive shielding structure and surround the conductive bump.

13. The method for forming the semiconductor device structure as claimed in claim 12, further comprising:
after forming the conductive bump and the ground bumps, forming a conductive shielding layer over top surfaces of the molding layer and the chip and sidewalls of the molding layer, the first interconnection structure, the substrate, and the second interconnection structure,
wherein the conductive shielding layer is electrically insulated from the chip and the conductive shielding structure.

14. A method for forming a semiconductor device structure, comprising:
forming a first hole and a second hole in a first surface of a substrate, wherein the first hole is wider than the second hole;
forming a first insulating layer in the first hole and the second hole and over the first surface;
forming a conductive layer over the first insulating layer and in the first hole and the second hole, wherein the conductive layer has a first recess in the first hole, and the second hole is filled with the first insulating layer and the conductive layer;
forming a second insulating layer over the conductive layer in the first recess, wherein the second insulating layer has a second recess in the first recess;
forming a conductive structure in the second recess; and
partially removing the substrate, the first insulating layer, the conductive layer, and the second insulating layer from a second surface of the substrate to expose the conductive structure and one end of the conductive layer in the first hole and the second hole while the second insulating layer covers a topmost surface of an opposite end of the conductive layer, wherein the conductive layer in the first hole surrounds the conductive structure.

15. The method for forming the semiconductor device structure as claimed in claim 14, wherein a first top surface of the conductive structure and a second top surface of the second insulating layer are coplanar.

16. The method for forming the semiconductor device structure as claimed in claim 14, wherein the forming of the conductive layer comprises:
forming the conductive layer over the first insulating layer, wherein the conductive layer conformally covers the first insulating layer in the first hole and the first insulating layer over the first surface; and
removing the conductive layer over the first surface.

17. The method for forming the semiconductor device structure as claimed in claim 16, wherein a first top surface of the conductive layer in the first hole, a second top surface of the first insulating layer, and a third top surface of the conductive layer in the second hole are coplanar after removing the conductive layer over the first surface.

18. The method for forming the semiconductor device structure as claimed in claim 14, wherein after partially removing the substrate, the first insulating layer, the conductive layer, and the second insulating layer from the second surface, the conductive layer in the first hole is tube-shaped and continuously surrounds a portion of the conductive structure.

19. The method for forming the semiconductor device structure as claimed in claim 14, wherein the second insulating layer is in direct contact with the conductive structure, the conductive layer, and the first insulating layer, and the first insulating layer is in direct contact with the conductive layer and the substrate.

20. The method for forming the semiconductor device structure as claimed in claim 14, wherein the partially removing of the substrate, the first insulating layer, the conductive layer, and the second insulating layer from the second surface of the substrate is performed while the first insulating layer covering the first surface is in direct contact with the second insulating layer.

* * * * *